(12) United States Patent
Ma et al.

(10) Patent No.: US 9,742,148 B2
(45) Date of Patent: *Aug. 22, 2017

(54) THERMO-OPTICALLY TUNABLE LASER SYSTEM

(71) Applicant: Redshift Systems Corporation, Burlington, MA (US)

(72) Inventors: Eugene Yi-Shan Ma, Newton, MA (US); Charles M. Marshall, North Andover, MA (US)

(73) Assignee: Redshift Bioanalytics, Inc., Burlington, MA (US)

( * ) Notice: Subject to any disclaimer, the term of this patent is extended or adjusted under 35 U.S.C. 154(b) by 169 days.

This patent is subject to a terminal disclaimer.

(21) Appl. No.: 14/572,044

(22) Filed: Dec. 16, 2014

(65) Prior Publication Data

US 2015/0103851 A1 Apr. 16, 2015

Related U.S. Application Data

(63) Continuation of application No. 13/473,256, filed on May 16, 2012, now Pat. No. 8,942,267.

(Continued)

(51) Int. Cl.
| | |
|---|---|
| *H01S 5/068* | (2006.01) |
| *G02B 5/28* | (2006.01) |
| *H01S 5/14* | (2006.01) |
| *B82Y 20/00* | (2011.01) |
| *H01S 3/106* | (2006.01) |
| *H01S 5/024* | (2006.01) |
| *H01S 5/028* | (2006.01) |
| *H01S 5/34* | (2006.01) |

(52) U.S. Cl.
CPC ............. *H01S 5/068* (2013.01); *B82Y 20/00* (2013.01); *G02B 5/288* (2013.01); *H01S 5/141* (2013.01);

(Continued)

(58) Field of Classification Search
CPC ........ H01S 5/068; H01S 5/141; H01S 5/3401; H01S 3/1062; H01S 5/02446; H01S 5/028; B82Y 20/00; G02B 5/288
See application file for complete search history.

(56) References Cited

U.S. PATENT DOCUMENTS 5,581,531 A * 12/1996 Ito .............................. G03F 7/26
369/100
5,819,842 A * 10/1998 Potter ........................ B01L 7/54
165/206

(Continued)

FOREIGN PATENT DOCUMENTS

JP 4504930 8/1992
JP 11307879 5/1999

(Continued)

*Primary Examiner* — Xinning Niu
(74) *Attorney, Agent, or Firm* — BainwoodHuang

(57) ABSTRACT

A tunable laser has a solid state laser medium having an optical gain region and generates coherent radiation through a facet. A lens collects the coherent radiation and generates a collimated light beam. Components of an external cavity include a reflective surface and an optical filter, the reflective surface reflecting the collimated beam back to the lens and the laser medium, the optical filter positioned between the reflective surface and the lens and having two surfaces with a thermally tunable optical transmission band within the optical gain region of the laser medium. The optical filter (1) transmits a predominant portion of the collimated beam at a desired wavelength of operation, and (2) specularly reflects a remaining portion of the collimated beam from each surface, the collimated beam being incident on the optical filter such that the reflected collimated beams propagate at a non-zero angle with respect to the incident collimated beam.

13 Claims, 13 Drawing Sheets

Related U.S. Application Data

(60) Provisional application No. 61/567,202, filed on Dec. 6, 2011, provisional application No. 61/487,119, filed on May 17, 2011.

(52) U.S. Cl.
CPC ............ *H01S 3/1062* (2013.01); *H01S 5/028* (2013.01); *H01S 5/02446* (2013.01); *H01S 5/3401* (2013.01)

(56) References Cited

U.S. PATENT DOCUMENTS

| | | | | |
|---|---|---|---|---|
| 6,285,504 | B1 * | 9/2001 | Diemeer | G02B 6/125 359/578 |
| 2003/0007539 | A1 * | 1/2003 | Sell | H01S 5/141 372/92 |
| 2003/0012250 | A1 | 1/2003 | Shirasaki | |
| 2003/0086655 | A1 * | 5/2003 | Deacon | H01S 5/026 385/50 |
| 2003/0231666 | A1 * | 12/2003 | Daiber | H01S 5/141 372/34 |
| 2006/0215713 | A1 | 9/2006 | Flanders et al. | |
| 2007/0133647 | A1 | 6/2007 | Daiber | |

FOREIGN PATENT DOCUMENTS

| | | |
|---|---|---|
| JP | 2003051633 | 2/2003 |
| JP | 2003152256 | 5/2003 |
| JP | 2006100415 | 4/2006 |
| JP | 2008544530 | 12/2008 |
| JP | 02009290206 * | 4/2009 |
| WO | 03005500 A2 | 1/2003 |

* cited by examiner

THERMO-OPTICALLY TUNABLE LASER SYSTEM

SUMMARY

Tunable optical components capable of varying optical transmission as a function of an input parameter have many applications in optics. One example is an air gap etalon with piezoelectric transducers that can vary its air gap and thus optical pass band as a function of an electrical signal. Another example is a silicon etalon with a passband that changes as a function of etalon temperature due to the temperature dependence of the index of refraction of silicon.

Quantum cascade lasers (QCLs) are unipolar solid state lasers that achieve lasing at infrared wavelengths, including wavelengths in the range between 3 and 13 um that are of considerable interest in molecular spectroscopy. QCLs are available in different design configurations, including distributed feedback (DFB), and Fabry-Perot (FP) lasers. Of particular interest in many spectroscopy applications are tunable lasers, that is lasers that through adjustment of an operating parameter can achieve lasing at different wavelengths. An adjustable parameter may include the operating temperature of the laser or the laser drive current. Lasers in DFB or FP configurations typically have very limited wavelength tuning ranges through such adjustments, as in both of these configurations the laser cavity is confined to the QCL lasing medium. However, external cavity devices that extend the laser cavity outside the QCL medium do not have the same limitation. Through the use of gratings or other wavelength selection components, relatively wide tuning ranges, in excess of 20% of a center wavelength, can be achieved if supported by the gain medium of the laser. Capability for a broad gain region is one feature of the QCL that is particularly attractive in molecular spectroscopy, as it helps to provide improved background discrimination as well as the ability to detect the absorption lines of multiple materials (gases, liquids and solids) of interest with a single laser. Thus, methods of tuning the laser to multiple wavelengths using wavelength selection components is of interest, particularly those that are amenable to low cost manufacturing and environmental stability in applications that encompass medical, industrial, environmental, military, and biotechnology markets. The following disclosure describes multiple embodiments of a thermo-optic tunable filter and multiple embodiments of thermo-optic tunable laser comprising one or more thermo-optic tunable filters as wavelength selection devices.

In one embodiment, an external cavity laser comprises a quantum cascade laser (QCL) and one or more thermo-optically tunable (TOT) filters within an external cavity of the laser. The filters are fabricated using micromachining (MEMS) process techniques and comprise one or more optical cavities containing at least one thermo-optic material and distributed Bragg reflector (DBR) mirrors made from at least two materials with different indices of refraction which may or may not also be thermo-optic in nature. Thermo-optic material as described herein means a material that has at least one optical property (e.g. its n or k value) that varies with temperature.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Figure 1:
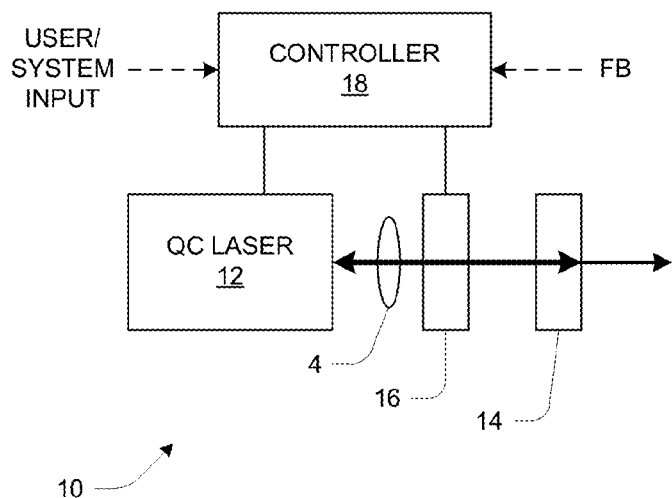
FIG. 1 is a block diagram of a laser system.

FIG. 1 depicts a tunable laser system 10 as including a quantum cascade (QC) laser element 12 and external cavity components including a lens 4, reflector 14 and a thermo-optic filter 16. Operation is controlled by a controller 18 which provides drive current to the QC laser 12 and heater control signals to the thermo-optic filter 16. The controller 18 typically operates in response to inputs including higher-level control input from a user or system, and feedback (FB) from laser operation which may be an indication of measured laser output power, wavelength or spatial mode, operating temperature of the laser or external cavity component(s), laser drive current, for example. The controller may operate the laser in pulse or continuous wave (CW) operation as known in the art. The controller may also generate one or more single pulses of a desired width and amplitude when in continuous wave operation in order to assist in tuning the laser system. The reflector 14 establishes one end of the laser cavity. In the illustrated embodiment, the reflector 14 is partially transmissive, and light transmitted through the reflector 14 constitutes the laser output. In another embodiment (not shown) the reflector may be fully reflective and the laser output generated directly from a facet of the QC laser element 12. The QC laser element 12 includes a QC laser gain medium configured to form an overall laser cavity with the reflector 14 and filter 16, and thus in some embodiments includes a separate facet reflector (not shown in FIG. 1) establishing the other boundary of the cavity. As generally known in the art, the QC laser element 12 can provide optical gain, and therefore support laser operation, across a relatively wide range of wavelengths (referred to as the "gain region"). The thermo-optic filter 16 is a thermally tunable wavelength selector that establishes specific wavelength(s) of laser operation. This selection of operating wavelength(s) can have both a coarse component and a finer component, as described in more detail below.

Figure 2:
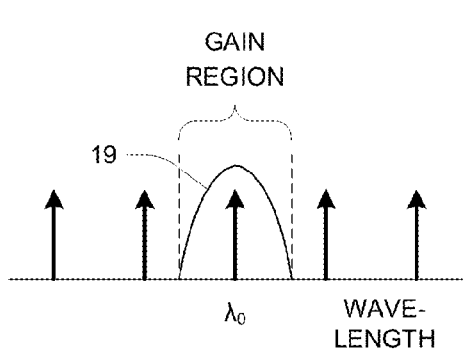
FIGS. 2 and 3 are plots of wavelength-dependent transmission peaks.
Figure 3:
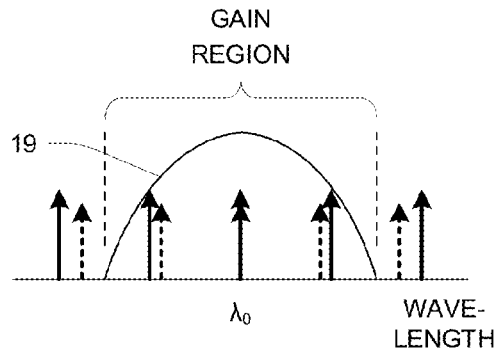

FIGS. 2 and 3 illustrate two separate approaches to design of the laser system of FIG. 1. The vertical arrows represent peaks of transmission of the thermo-optic filter 16 as a function of wavelength. The periodic aspect of the transmission peaks characterizes certain types of optical thin-film filters, as described in more detail below. Also shown are "gain curves" 19 representing a gain-versus-wavelength characteristic of the QC laser 12. FIG. 2 shows a case in which the gain region of the QC laser 12 overlaps with only one transmission peak, at a wavelength shown as $\lambda_O$. This limited overlap can be achieved by suitable design of the QC laser element 12 and the thermo-optic filter 16, and is an example of coarse wavelength selection—the laser system will operate only at the wavelength $\lambda_O$ of the one overlapping transmission peak. As described more below, the exact value of $\lambda_O$ can be varied during operation by adjustment of the temperature of the thermo-optic filter, providing for finer selection of operating wavelength.

FIG. 3 illustrates another approach in which the gain region of the QC laser 12 overlaps with multiple transmission peaks of a single optical filter element. In this case, the thermo-optic filter 16 includes two separate elements, one exhibiting a pattern of transmission peaks at a first periodicity and the other exhibiting a pattern of transmission peaks at a second, generally different periodicity. These are shown in FIG. 3 by the solid and dashed arrows respectively. In this case, lasing—under continuous wave operation—occurs at only the wavelength(s) at which both elements have a transmission peak, such as at $\lambda_O$ as shown. Under pulse mode operation, lasing generally occurs at wavelengths where there is sufficient overlap, scaled by the amount of overlap. One or both of the filter elements are thermally controlled to achieve finer selection of the wavelength of operation.

FIG. 3 illustrates how a pair of filters may be tuned within the QC laser cavity to generate a spectrally varying laser output, which may be used, for example, in gas sensing. The two filters may be designed with slightly different spectral transmissions such that by controlling the temperature of one or both filters, an operating wavelength of high transmission through both filters can be achieved. Depending on the type of filter, this may be referred to as vernier tuning, and the filters may be of an etalon type with slightly different free spectral ranges in order to achieve the desired optical bandpass and total tuning range characteristics.

A laser incorporating the above principles may be particularly advantageous for sensing multiple gases. Instead of the continuous tuning of grating tuned lasers, or the mechanical complexity of mechanically switched filters, these thermo-optic filters can be designed to transition from one target wavelength to another target wavelength with a duty cycle (% of a repetitive time period at the targeted measurement wavelengths) that exceeds 90% or 99% with a filter that is designed for rapid thermal response. For a combined filter design with three selectable transmission peaks, two gas lines of interest and a reference wavelength may all be included with high duty cycle.

Although FIGS. 2 and 3 correspond to use of one and two filter elements respectively, more than two filter elements or a combination filters and other spectrally discriminating devices (e.g. diffraction grating) may also be used. Overall, the exact configuration will generally depend on the wavelength characteristics of the QC laser 12, the combined spectral characteristics of the filter elements, and the requirements of the laser output for a particular application.

Figure 4:
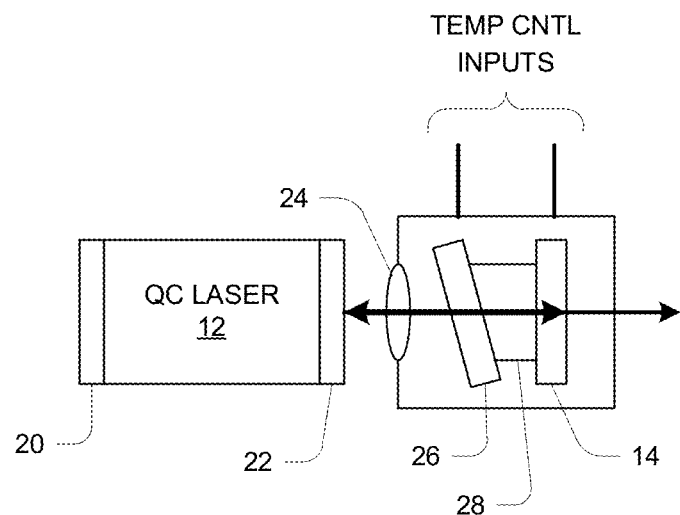
FIGS. 4 and 5 are schematic diagrams of laser systems showing details of thermo-optical filters.
Figure 5:
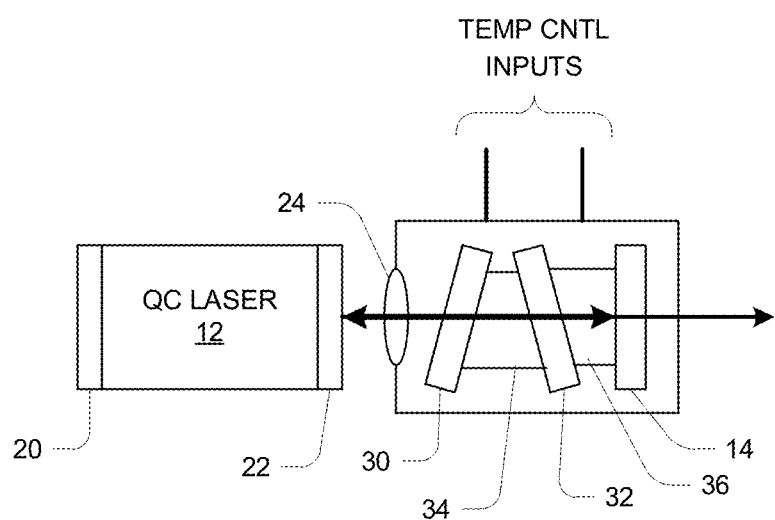

FIGS. 4 and 5 show example configurations of both types, i.e., using only one filter element and using two filter elements. In each case, the QC laser 12 has a high reflectance (HR) back facet coating 20 and an antireflective (AR) front facet coating 22. The HR back facet coating 20 and reflector 14 define the boundaries of the laser cavity, and the reflector 14 is partially transmissive in order to output couple the laser beam signal, which is collimated by action of lens 24. In FIG. 4 a single thin-film filter element 26 forms the filter 16 of FIG. 1, while in FIG. 5 it is formed by a pair of thin-film filter elements 30, 32 as discussed above in connection with FIG. 3. In each case, the thin-film filter elements 26, 30, 32 are preferably tilted slightly away from the optical axis to direct reflected light (see FIGS. 6 and 7 described below) out of the cavity. Optically transparent wedge-shaped substrates 28, 34, 36 may be used to maintain the desired spacing and orientation of the thin-film filter elements 26, 30, 32 and reflector 14. Generally, for a laser facet aperture which is much less than a millimeter wide and an optical beam that is on the order of a few millimeters in diameter, angles of incidence that are even a few degrees off-normal (e.g. <10 degrees) are sufficient to achieve this purpose. Angles much greater than 40 degrees, for example, may lead to a reduction of filter performance, in particular, widening of the filter bandpass.

The laser system may be mounted on a thermally conductive substrate and thermo-electric (TE) cooler (neither shown), and both the QC laser 12 and filter 16 are electrically connected to the controller 18 providing electrical control signals to and from the devices as needed. The signals to the filter 16 will typically be controlled to achieve a desired temperature (and therefore optical transmission) over time. The laser system may be contained within a hermetic package (e.g. "butterfly" or TO style package), and may have one or more transmissive windows enabling output of the optical signal from the laser package.

While the QC laser 12 is an element of the disclosed embodiment, other types of lasers with the ability to support lasing at multiple wavelengths within a gain region of the electromagnetic spectrum (e.g. visible, near IR and far IR spectrum) may instead be used. For any given application there will be a corresponding selection of external cavity design and optical materials for the wavelengths of interest.

In one embodiment, the reflected light reflected off a filter (e.g., 26) may be used to provide an output signal from the laser. The filter may be designed to achieve a reflectance for providing the desired output signal power level. This reflected light may be the primary output signal from the laser (i.e. no output coupling from the reflector 14 or other optical elements), or it may be a secondary output signal used to monitor laser operating characteristics (e.g. power or wavelength). The secondary signal may be also be used as part of a control loop (e.g., the feedback FB shown in FIG. 1) for the laser or filter control signals. Since reflected light is generated each time the collimated beam is incident on the filter, two reflected output signals may be generated for each filter element. Reflected light may be bounced off another element in the cavity (e.g. reflector 14) in order to meet certain mechanical constants of the tunable laser system.

During operation of the system, both incident and reflected collimated beams will be at a desired wavelength of operation. The percentage of the collimated beam incident on the filter that is reflected may vary as a function of tuning the TOT filter such that, by way of example, the power of the reflected collimated beam increases, thereby increasing the intra-cavity losses and reducing the power of output light coupled through the partially transmissive mirror 14. The TOT filter transmission function may be designed such that the percentage change in the power of the reflected collimated beam changes at a greater rate than the power of the laser output coupled directly out of the cavity as, for example, through partially transmissive reflector 14. This increased rate of change may be advantageous in providing a feedback signal for control of the system.

A reflected collimated beam may be used to generate other types of feedback signals. The reflected collimated beam power represents a loss mechanism within the external cavity and is a component of laser efficiency. When the TOT filter transmission at the wavelength of operation is reduced, either by, for example, misalignment of the transmission peaks of two TOT filters or by operation of the TOT-QCL laser at a wavelength other than at a peak wavelength of the TOT filter, the power contained in the reflected collimated beams (and this the cavity loss) increases. It may be desirable to operate the laser where the ratio of the power in the reflected beam to the output power is minimized. Thus, as the electrical power to the QCL is changed or the TOT-QCL wavelength is changed, the ratio of reflected collimated beam power to output power may be used as a feedback signal to the TOT-QCL controller.

Referring to FIG. 5, if one filter (e.g., 30) is fixed (i.e., not thermally tunable) while the other one (e.g., 32) is, spectral coverage may not be continuous. However, if both filters 30, 32 are tunable, continuous spectral coverage can be achieved.

Figure 6:
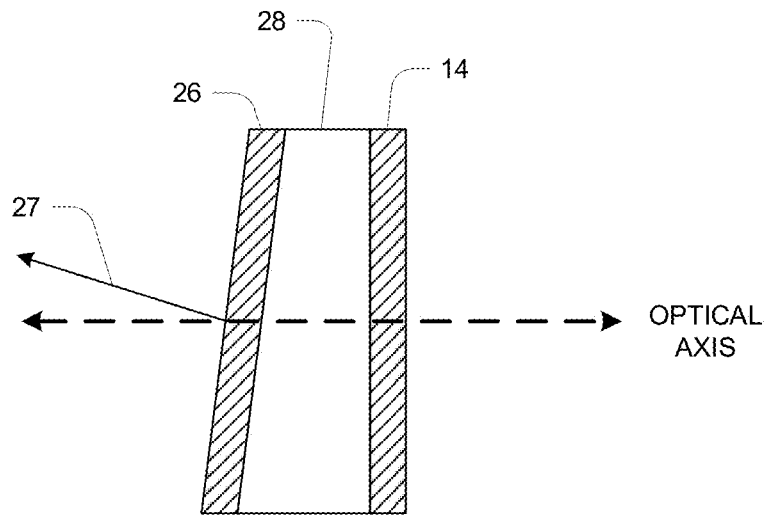
FIGS. 6 and 7 are schematic diagrams of filter structures.

FIG. 6 shows an embodiment in which the reflector 14 is combined onto the same structure as filter 26, with the mirror reflective surface perpendicular to the optical axis to feed the reflecting light back into the laser gain medium (QC laser 12) and using a wedged substrate 28 for angling the tunable filter 26 with respect to the laser optical axis. FIG. 6 also shows the above-discussed reflected light 27 from one side of the filter 26.

Figure 7:
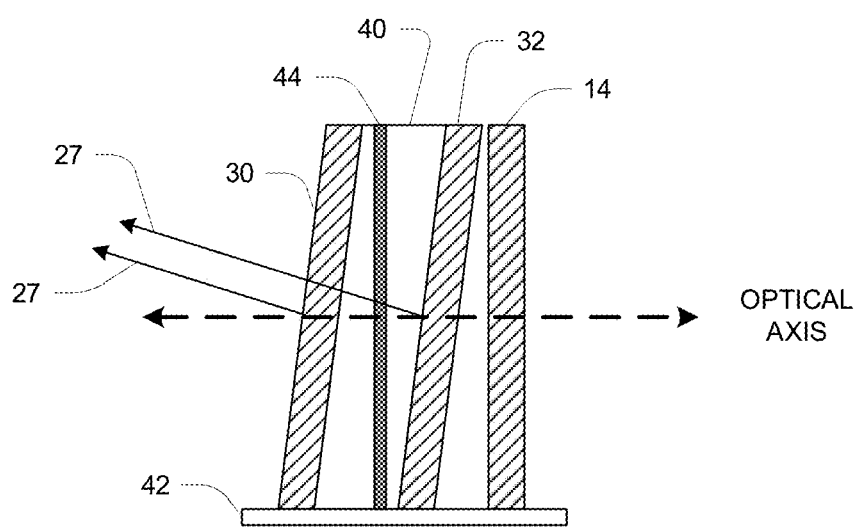

FIG. 7 shows another embodiment in which thin-film filters 30, 32 are combined on opposing surfaces of a common thermally conductive and optically transparent substrate 40 (e.g. silicon or germanium), preferably using a wedge shape or other sloping surfaces to divert reflected light from each filter 30, 32 out of the external cavity. In another embodiment, the common thermally conductive substrate 40 need not be optically transparent if it contains a "donut hole" for passing the laser light between the filters on the opposing surfaces over the hole. In this manner, thermally and/or electrically conductive materials—metals such as aluminum or ceramics such as $Al_2O_3$—may be used as the substrate. The common substrate may then be attached to a TE cooler to control the temperature of the substrate or provide an athermalized optical platform for the external cavity. This TE cooler may also be attached to the QC laser 12 to simultaneously assist in controlling the temperature of the laser. More than two filters may also be stacked in a single device, combining filters and wedged shaped substrates in a "sandwich" of layers.

More specifically, in FIG. 7 the two thin-film filters 30, 32 are combined structurally on a common mount 42, typically constructed from one or more highly thermal conductive metal, ceramic or semiconductor materials. The structure includes an etalon to provide a reference free spectral range (for determining wavelength of operation) or to provide preferential longitudinal modes for improving the stability of a thermo-optically tunable QC laser (TOT-QCL) system. The etalon defining material support arm 40 has one surface with suitably optically reflective coatings which forms one reflecting surface of the etalon and a second surface that is thermal and mechanical support structure for one of the filters 30, 32. The etalon cavity 44 may be an air gap or a material with a different index of refraction than the etalon defining material. The filters 30, 32 are angled with respect to the optical axis whereas the etalon is orthogonal to the optical axis. If the etalon is an air gap type, then the gap may contain a vacuum or be filled with a gas that provides spectral absorption at reference wavelengths useful for maintaining the wavelength calibration and stability of a system. The support arms 40 are wedged shaped and may be designed such that the tunable filters 30, 32 are parallel, are at non-perpendicular arbitrary angles with respect to the optical axis, or are at the same positive and negative angle with respect to the optical axis such that the optical beam does not deviate in accordance with Snell's Law. The carrier 42 that holds both the support arms may also hold an output coupling mirror 14 which is partially transmissive, thereby holding the tunable filters, etalon (optional) and mirror in optical alignment. In another aspect, a lens may be mounted to the carrier, thereby providing a single assembly for alignment to a laser and also providing a single athermalized assembly.

In another embodiment, a thermo-optical filter can be deposited on the surface of a lens such as lens 24, or on a flexible substrate that may be bonded to a curved surface of the lens.

Figure 8:
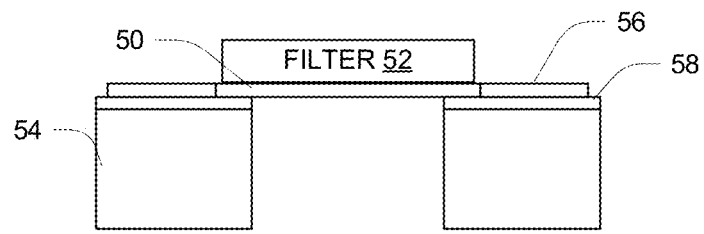
FIGS. 8-10 are diagrams showing MEMS construction of a filter structure.
Figure 9:
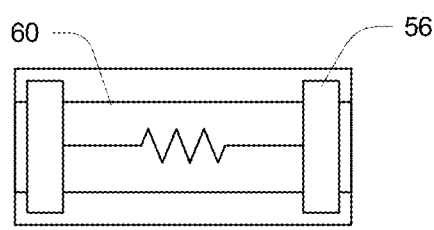
Figure 10:
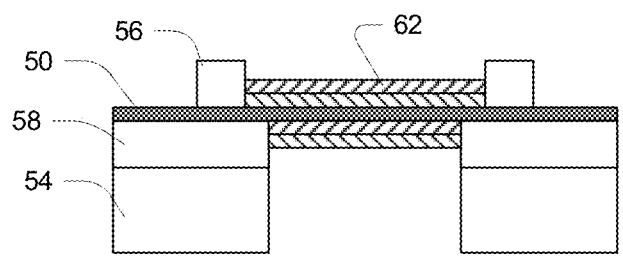

FIGS. 8-10 show a general architecture of a tunable filter embodiment. In the embodiment as shown, the optical filter element is fabricated on a silicon-on-insulator (SOI) wafer using microelectromechanical (MEMS) and semiconductor processing techniques. FIG. 8 illustrates one embodiment in which an optically transmissive resistive sheet heater 50 for changing the temperature of the optical filter element 52 is contained in one or more the layers outside the optical filter element 52. Also shown are silicon "handles" 54 (e.g. silicon substrate), heater electrical contacts 56 and electrical leads (not shown) separated from the handles 54 by a buried oxide (BOX) layer 58. FIGS. 9-10 show an aspect of the embodiment where an optically transmissive resistive heater 60 (e.g. lowly doped crystalline silicon or germanium) is contained within the thermo-optic cavity layer(s) of the filter. Also shown in FIG. 10 are DBR mirrors 62 of the optical filter element 52. In another embodiment (not shown), an optically opaque heater (e.g. metal ring heater) is fabricated surrounding the filter element. Optically transmissive materials that could be used as resistive heaters include but are not limited to silicon, germanium, and their alloys. In another embodiment (not shown) the filter element 52 is comprised of the SOI device layer with suitable thickness for forming the thermo-optic cavity, and with deposited DBR mirrors on the upper and lower surfaces of the layer, The optical stack structure may also be designed to include the BOX layer.

Figure 11:
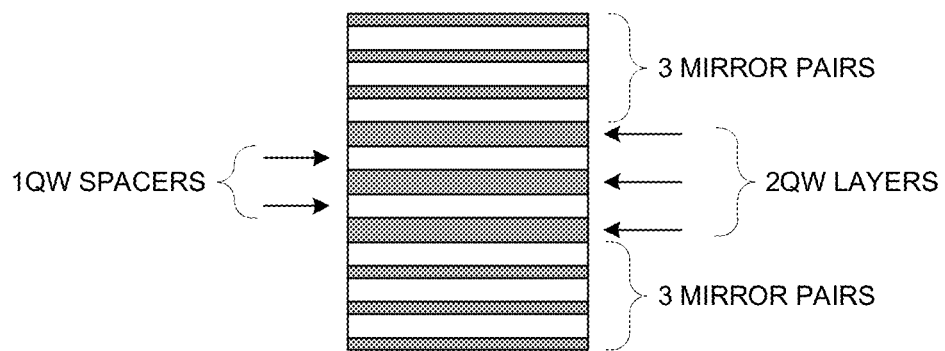
FIGS. 11-12 are schematic diagrams of multi-layer thin-film filters.
Figure 12:
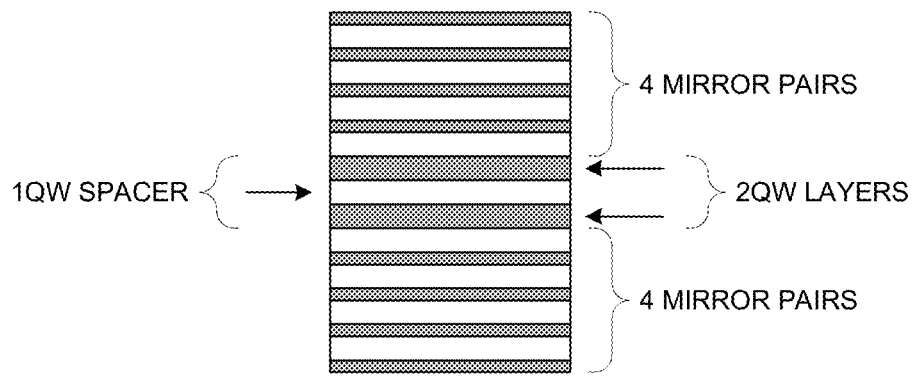

FIGS. 11 and 12 show two examples of multi-cavity filters constructed using even quarter wave (QW) thermo-optic cavity layers of a first material separated by odd QW spacer layers of second material with greater or lesser index of refraction, and surrounded with DBR mirrors. FIG. 11 illustrates a design with three cavities, referred to as a "32223 triple peak", while FIG. 12 illustrates a design with two cavities and referred to as a "4224 double peak". For filter pairs or single cavity etalons that operate together to perform tuning, it is desirable to have filters with different spacings between transmission peaks which may be accomplished by varying the thickness of the cavity layers or spacer layers or both in a particular filter formula. The cavity design and the number of cavities required for a particular application depend on many design parameters, including the number of wavelengths to resolve, desired laser output characteristics, the materials used in the cavities and DBR mirrors, the number of DBR mirror pairs, and the filter optical-mechanical-thermal design requirements. These layers may be deposited on a substrate using industry standard deposition techniques (e.g. PECVD, IBS, e-beam, etc. depending on the materials being deposited).

Triple-cavity designs such as that of FIG. 11 can be used to measure three discrete wavelengths, which can be useful in the detection of NO and $NO_2$ gas species for example. Another triple cavity design utilizes a two-mirror pair, triple 4QW cavity, 3QW spacer construction. Examples of materials used for the high and low index layers include, but are not limited to, amorphous silicon and $Ta_2O_5$, respectively. Alternatively, both high and low index layers used in mirror pairs may be constructed of materials neither of which are dielectrics. In fact, they may both be semiconductors (e.g. silicon and germanium), as long as there is index contrast at the wavelength of interest. Care must be taken in the selection of materials to match the wavelengths of interest since even extinction coefficients as low as $10^{-3}$ can lead to substantial filter transmission loss inside a resonant optical structure.

The thermal time constant associated with heating and cooling of the filter is determined by the thermal conductance between the filter and its surroundings and the effective thermal mass of the filter. A filter that is thermally isolated from its surroundings (e.g. see microbolometer structures) requires less power to change filter temperature but also reduces the response time of the filter. Similarly, a thicker filter will typically have higher thermal mass and a reduced response time (i.e. longer time constant).

The filter may comprise at least one of a heater element and temperature sensing element. One or more heaters may be used on a single filter device. This would allow for the deliberate creation or compensation of temperature gradients across the filter separate from the control of the average temperature of the filter.

The heater may consist of a patterned metal and the temperature sensing element (e.g. RTD) may consist of a patterned metal, where the patterning provides the desired electrical and thermal properties. Patterning may be achieved using techniques such as photolithography or shadow mask. Deposited Pt, Ni, Cr may be used as heater material. Since these materials are optically opaque, they would likely be patterned outside of the beam path.

The heater may also be made by diffusion doping the semiconductor material (e.g. Si, Ge). Resistor patterns include but are not limited to ring heaters, serpentine heaters, or sheet heaters.

The heater and temperature sensor may be used in a control loop to set the filter at a desired temperature over time. In one aspect of operation, the temperature may be maintained at a specific temperature over time. In another aspect of operation, the temperature may be ramped up and followed by a cool down or settling period. In another embodiment, a TE cooler thermally coupled to the filter may be used to lower the temperature of the filter below ambient temperature or to accelerate a cooling cycle of the filter.

During operation, a TOT filter may experience a thermal gradient across the active filter element (i.e. that portion of the filter with tunable transmission and interacting optically with the laser beam). In one example, the filter and sheet heater are defined as a wide strip on top of a thin thermally insulating membrane which is thermally attached (i.e. grounded to a heat sink) on all four sides (e.g. FIG. 8 wherein the BOX layer 58 extends underneath the heater 50). A filter temperature gradient may broaden the spectral bandpass and increase the average transmission loss of the filter since the peak transmission wavelength will vary across the plane of the filter and therefor across the collimated beam incident on the filter. Thermal gradients may arise from multiple causes, including the mechanical design and thermal isolation structure of the filter, the amount and physical location of the thermal conductivity paths, absorptive heating of the laser beam in the filter, heating of a temperature sensor, and nonuniformities induced by the heater. In one embodiment, the shape and resistivity of the heater or the thermal isolation region may be designed to reduce non-uniformities induced by other sources such as laser absorption. For example, a heater that surrounds the filter or is embedded throughout the filter on a thermally isolated membrane may have regions of higher and lower resistivity, or higher and lower pattern density, to provide non-uniform heating of the membrane in such a manner as to counteract non-uniform heat loss through thermal isolation structures. Similarly a transparent heater in contact with one surface of the filter may be designed to have nonuniform thickness or physical placement or patterning such as to counteract heating of the filter by absorption of the laser light. The collimated beam may also be non-uniform in nature, as may result from an asymmetrical beam, Gaussian beam shape, or presence of multiple transverse spatial modes. The heater may be shaped to reduce the temperature gradients resulting from non-uniform absorptive heating that may result from such collimated beam.

Figure 13A:
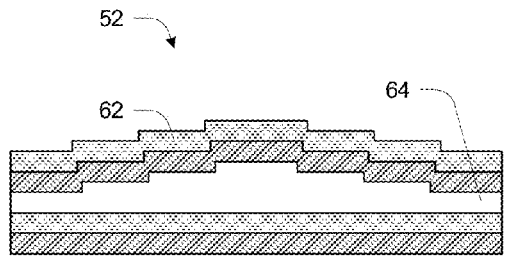
FIGS. 13(a) and 13(b) are schematic diagrams of filter structures.
Figure 13B:
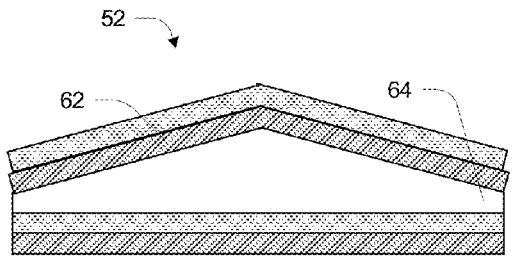

Additionally, as shown in FIGS. 13(a) and 13(b), the filter transmission may be constructed such that it varies spatially across the filter surface (i.e. perpendicular to the optical axis) in such a manner as to counteract the thermal nonuniformities and maintain the required filter optical properties. As an example, thermal non-uniformity which might concentrate higher temperatures (and thus longer wavelengths) at the center of the filter could be compensated by deliberate film deposition where the center of the filter is slightly thinner (shorter wavelengths) than the edges of the filter. FIGS. 13(a) and 13(b) (not to scale) show an embodiment of a spatially varying filter 52 with thermo-optic cavity 62 and DBR mirror pairs 62 on the upper and lower surfaces of the cavity 62. In FIG. 13(a), the spatial variation is a series of discrete steps in thickness of the cavity 62. In FIG. 13(b), the spatial variation is a continuous variation in thickness of the cavity 62. This can be accomplished using photolithographic photoresist developing (e.g. partial photoresist development to create a spatial variation in etching rates), etching, deposition and masking techniques as known in the art. The discrete thickness steps of the filter of FIG. 13(a) may act as a diffractive grating that changes the transmitted and reflected light of the filter. The step size, spacing and shape (e.g. rectangular, circular, etc.) may be designed to perform as a non-thermally tunable optical element or grating within the TOT-QCL to disperse light at certain wavelengths.

Figure 14:
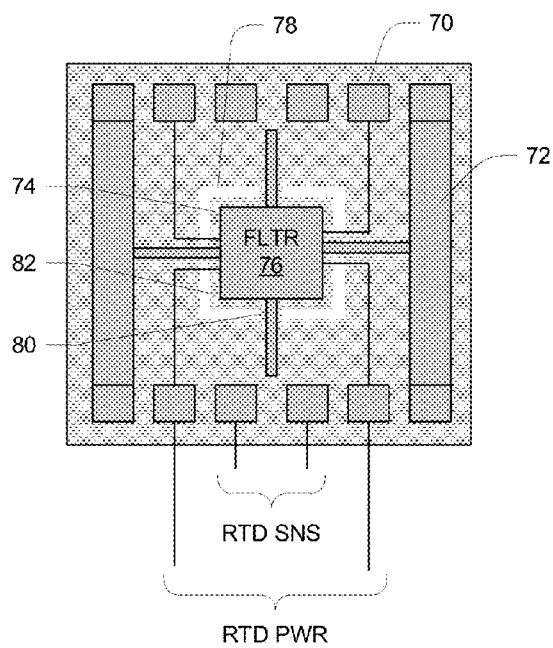
FIGS. 14-15 are diagrams depicting a layout of an integrated circuit structure.
Figure 15:
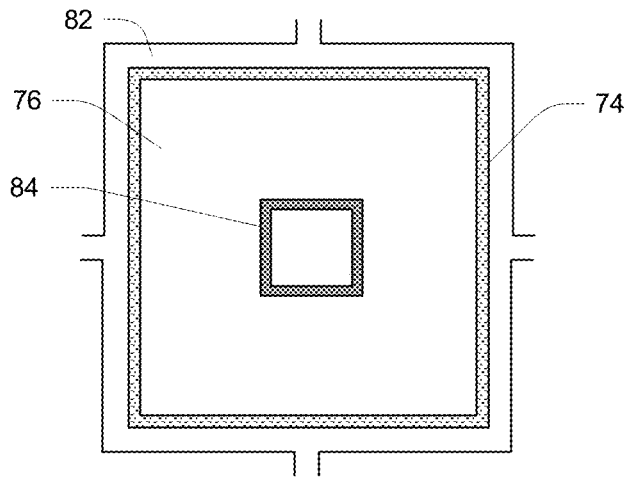

FIGS. 14 and 15 show an example TOT filter layout with bonding pads 70, metal connective lines 72, a thermal isolation region 78 comprised of patterned thermal isolation legs 80, and thermal isolation platform 82 comprised of a heater 74, two four-point measurement resistance temperature detector (RTD) temperature sensors (not shown), and thermo-optic filter region 76. In this aspect, the layout has symmetry to reduced thermal gradients resulting from the thermal conductivity of the leads for the heater, RTD temperature sensors and bonding pads. In another embodiment, the thermal isolation region may be nonpatterned and a solid sheet of one or more materials. In another embodiment, the thermal isolation region 78 may be patterned with isolation legs 80 of different geometries to change the thermal isolation of the thermo optic filter region 76 and in this manner change the temporal response of the filter and the power required in the heater for to achieve a given change in filter temperature. FIG. 15 shows another embodiment of the thermal isolation platform 82 with the ring heater 74 and a gradient heater 84 (connective leads 72 omitted for clarity). The gradient heater 82 may be advantageous for increasing or decreasing thermal gradients in thermo-optic filter region 76 as will be discussed.

In the embodiment as shown the heater 74 is a "ring" type heater surrounding the filter 76 on the thermal isolation platform 82 as will be apparent in subsequent figures. Similarly, in this embodiment two RTD type temperature sensors are placed in proximity to the heater on the thermal isolation platform 82. Fewer or more temperature sensors and other types of sensors may also be used. Similar to the prior heater embodiments, instead of or in addition to the ring heater, the heater may comprise one or more layers within the thermo optic filter region 76. The heater may also be an optically transparent layer placed inside or outside the thermo optic filter region 76. The temperature sensor may similarly be constructed by use of a material with the desired properties. For example, silicon of the appropriate doping, thickness and shape may be used as a temperature sensor and also be a material forming a layer a filter mirror or quarter wavelength cavity.

FIG. 16 through FIG. 26 describe a fabrication process for a filter aspect where the filter cavity is approximately defined by the device layer of an SOI silicon wafer. It is illustrative of the techniques used to fabricate the filter aspects described herein. In the embodiment as shown, the thermal isolation region comprise the mirror layers of the filter and in this manner the mirror materials function as the thermal isolation structure, as well as the optical filter structure and mechanical support to the devices on the filter region. Other embodiments are also possible, including the use of fewer mirror layers within the thermal isolation region in order to change the thermal isolation, or the use of one or more cavity layers to achieve a similar result. In the illustrated embodiment, the electrical leads of the heater and temperature sensor also cross the thermal isolation region and are patterned to increase thermal resistance while maintaining acceptable electrical conductivity. The patterned leads thus comprise the thermal isolation region and in one embodiment may exclusively comprise the thermal isolation region.

Figure 16:
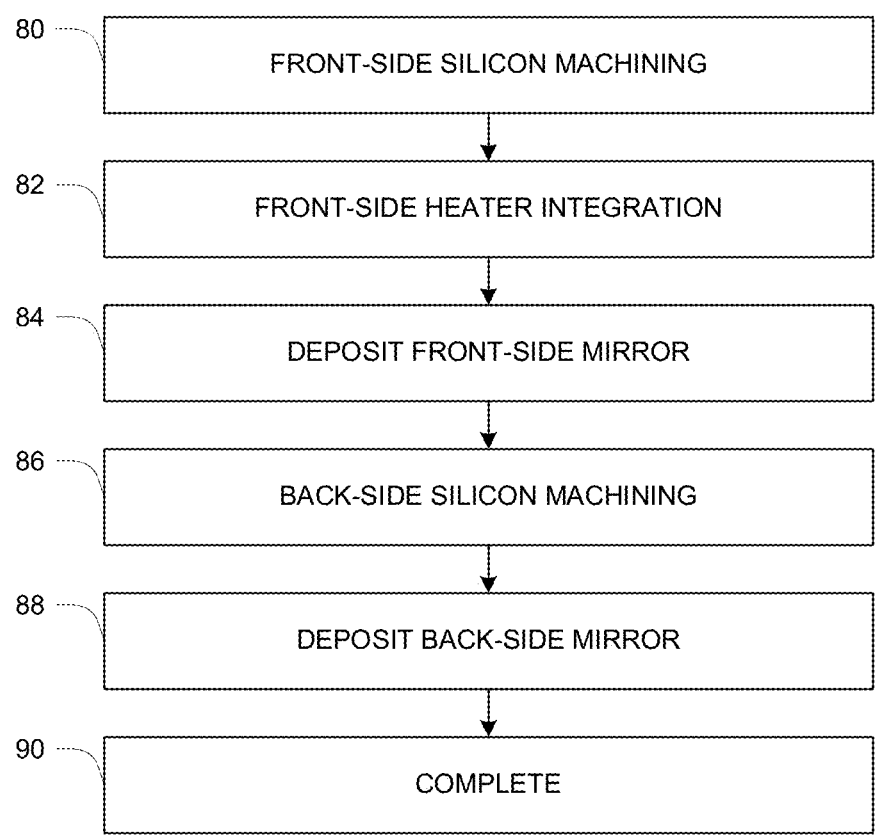
FIG. 16 is a flow diagram of a MEMs-based method of manufacturing a filter structure.
Figure 17:
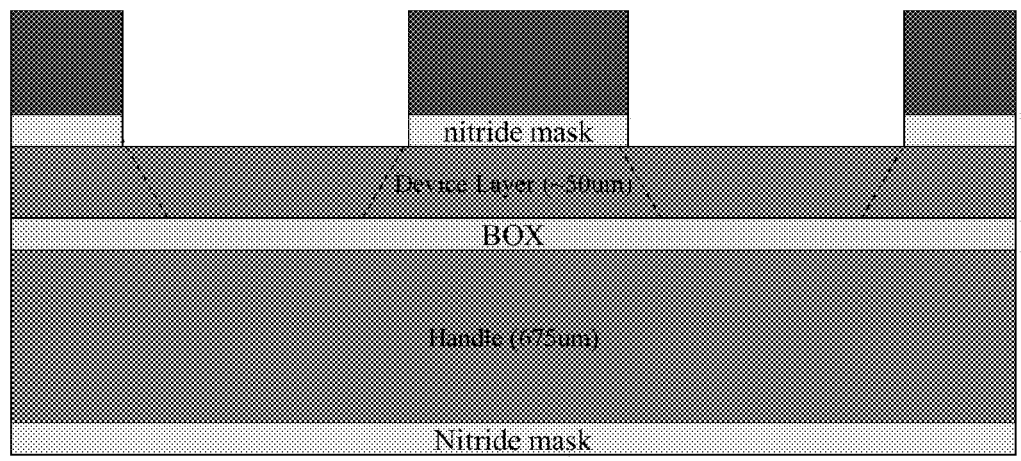
FIGS. 17-26 are diagrams depicting a MEMS workpiece at different stages of the manufacturing method of FIG. 16.
Figure 18:
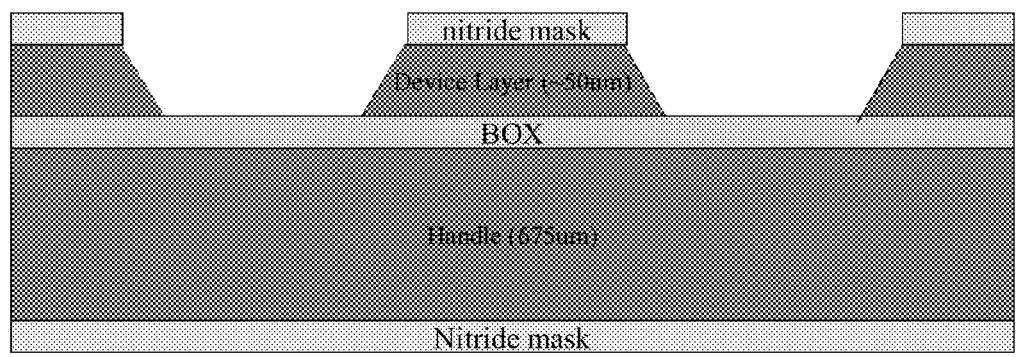
Figure 19:
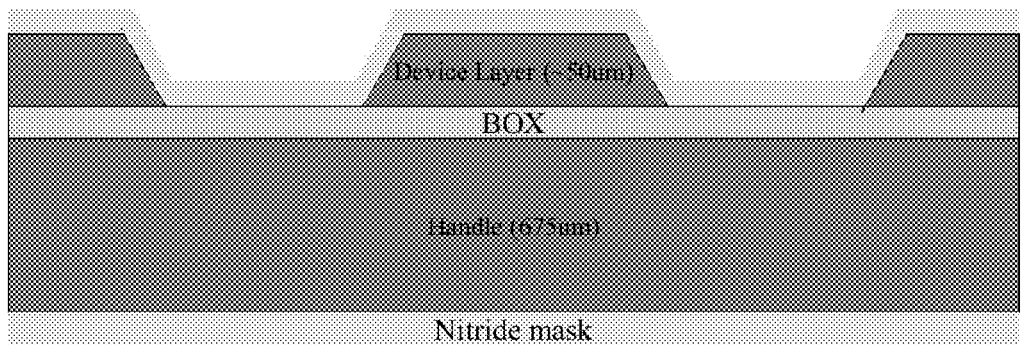
Figure 20:
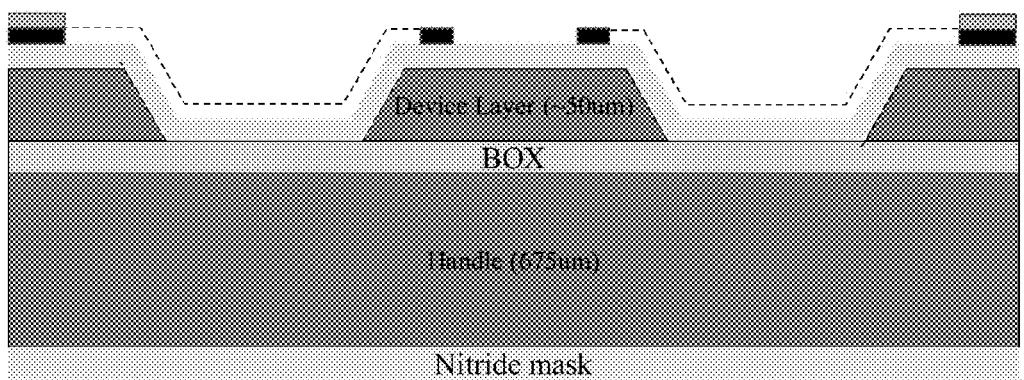
Figure 21:
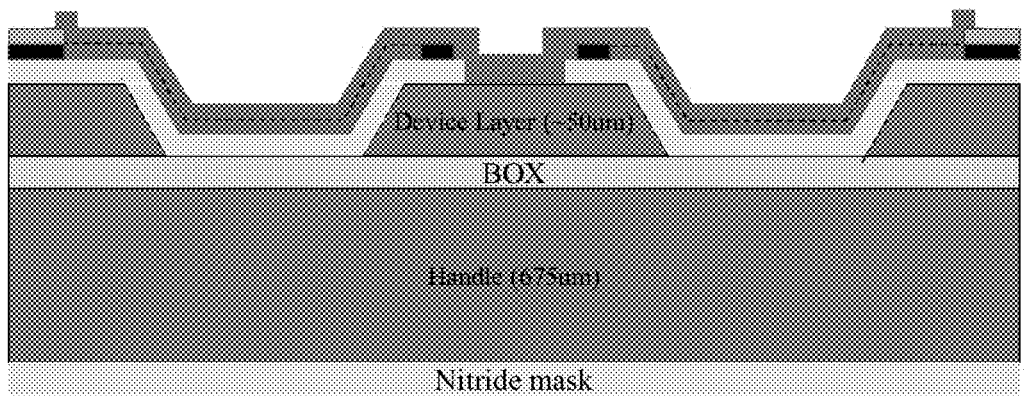
Figure 22:
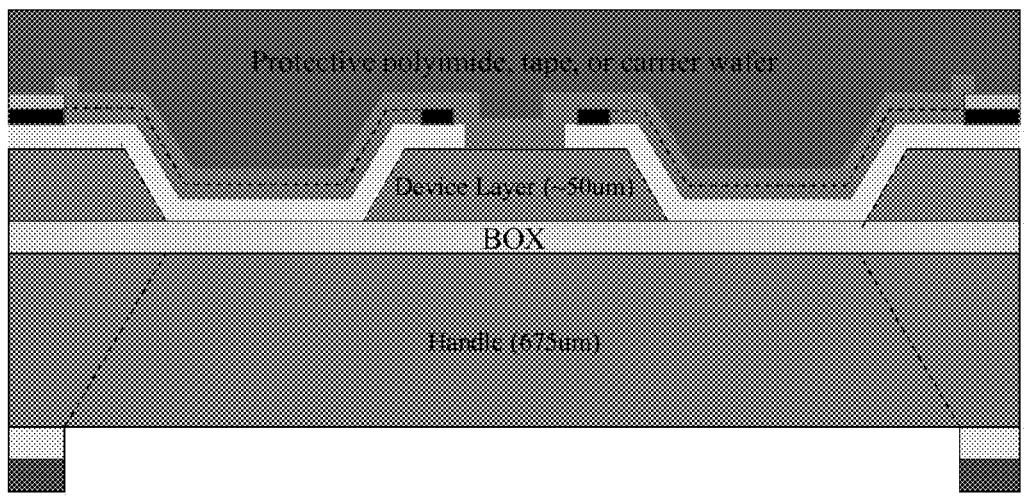
Figure 23:
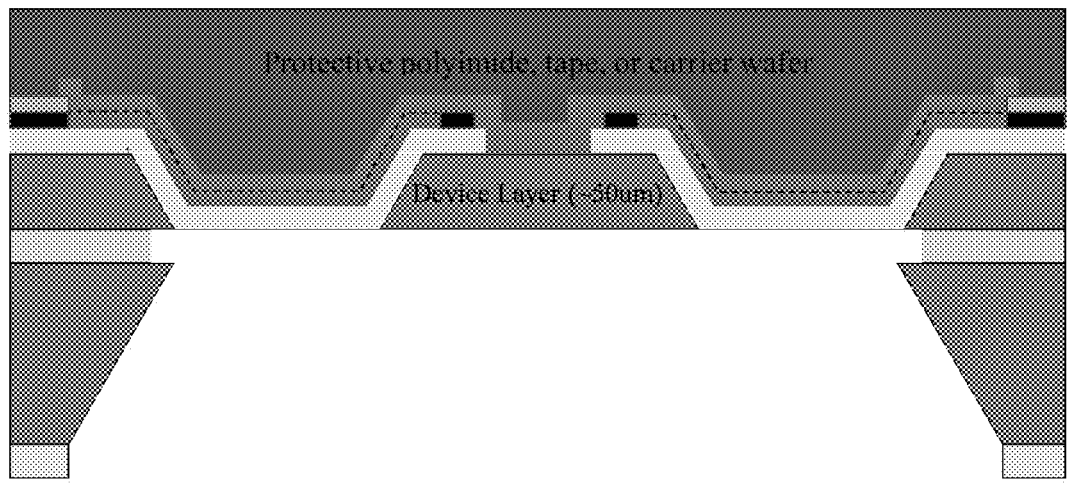
Figure 24:
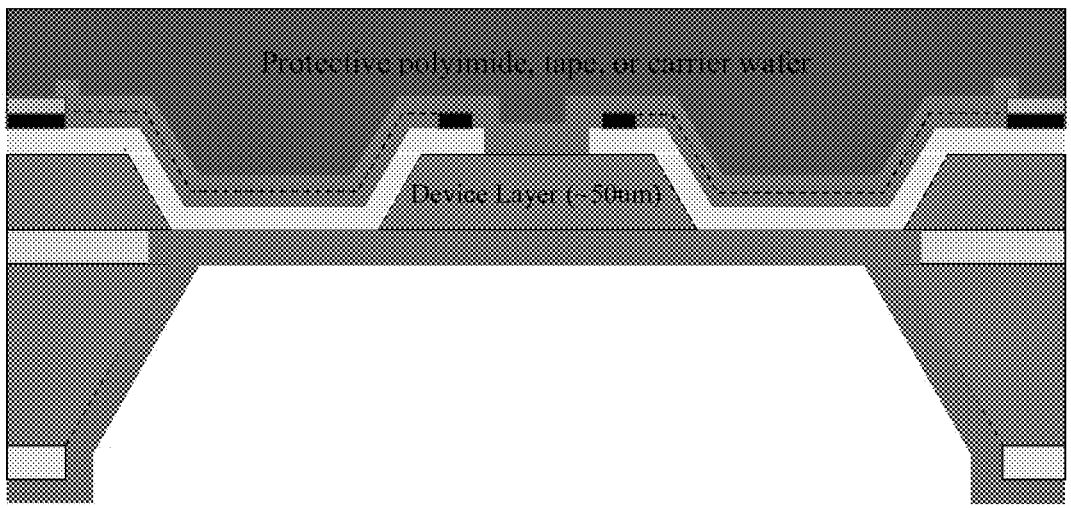
Figure 25:
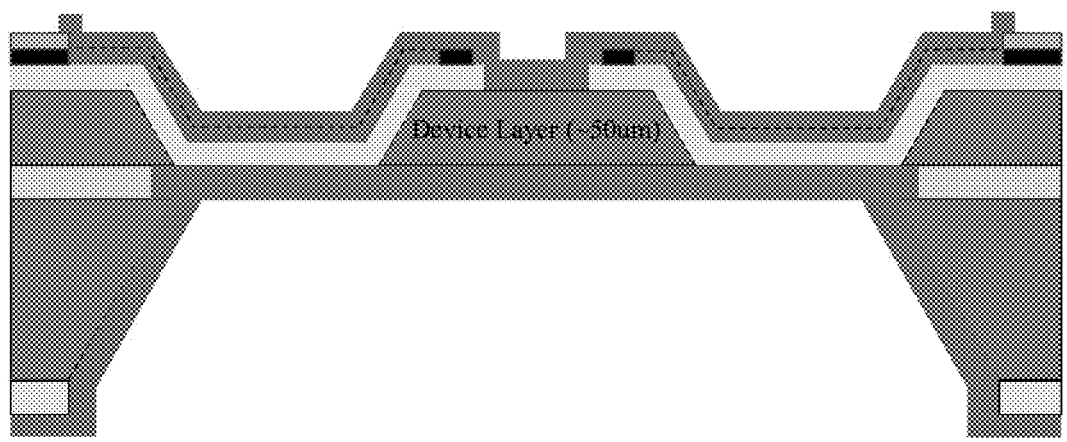
Figure 26:
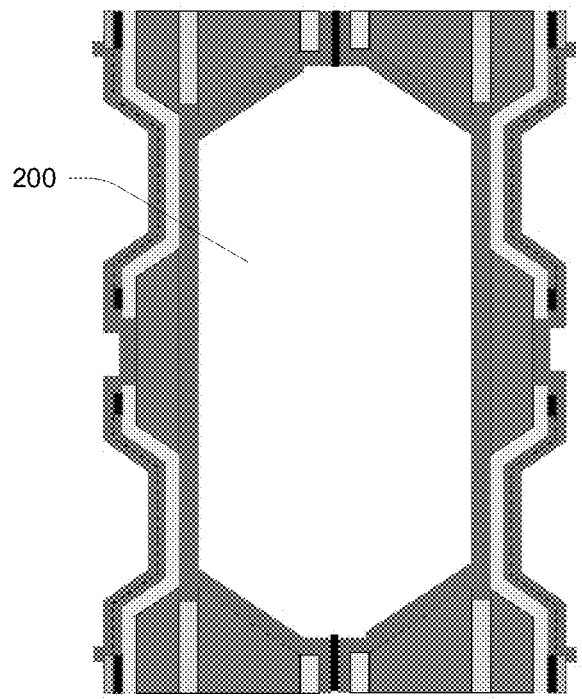

As shown in FIG. 16, the fabrication process includes the following steps:
1. At 80, performing front-side silicon machining. This includes use of KOH for sloped sidewalls, and stripping and redepositing LPCVD nitride unless it is smooth and undamaged. FIGS. 17-19 illustrate intermediate stages of processing.
2. At 82, front-side heater integration. This includes Ti metallization and patterning over a roughly 50 um sloped topology. This is shown in FIG. 20.
3. At 84, depositing the front-side mirror, which may be of SiNx/a-Si or $Ta_2O_5$/a-Si or Ge/Si. This step includes etching contact pad holes and possibly defining support bridges for higher thermal resistance. This is shown in FIG. 21.
4. At 86, back-side silicon machining. This includes protecting the front side using a hard-cured polyimide, then a sequence of patterning nitride hard mask, KOH, and BOE. This is illustrated in FIGS. 22-23.
5. At 88, depositing the back-side mirror, which again may be of SiNx/a-Si or $Ta_2O_5$/a-Si or Ge/Si. This is a blanket coat—no patterning—as shown in FIG. 24.
6. At 90, completing the process, which will typically include dicing and other finishing steps. This is shown in FIGS. 25-26. The filters can be integrated as shown in FIG. 26. In this embodiment, the filter die are bonded together, either at the die or wafer level using anyone of a number of techniques known to those conversant in MEMS technology.

As described previously, the thermal isolation region may be patterned to achieve a desired thermal isolation of the filter island. The shape of the patterning may be determined by considerations of material, process and layout considerations. The shape may also be determined in order to achieve a certain thermal profile or gradient across the filter island. In one embodiment, one or more of the shape and location of the heater, laser beam, filter thermal isolation platform, electrical leads, bonding pads, and thermal isolation region may be used to reduce thermal gradients across the filter. In one embodiment, as an example, the electrical leads and bonding pads are located and patterned such as to have symmetry and thus reduced thermal gradients in the filter island, thermal isolation region and the region surrounding or attached to the thermal isolation region on the side opposing the filter island.

Certain Specifics and Alternatives

A TOT-QCL laser wherein the filter element optical area is larger than the collimated beam of the laser. In one embodiment, the filter diameter is at least 22% larger than the $1/e^2$ diameter of the beam (diameter in this context refers generally to the two dimensional spatial extent of the beam orthogonal to the direction of beam propagation and is not meant to strictly imply a circular or symmetrical beam cross section). This may be advantageous in improving the thermal uniformity of the filter.

Figure 27A:
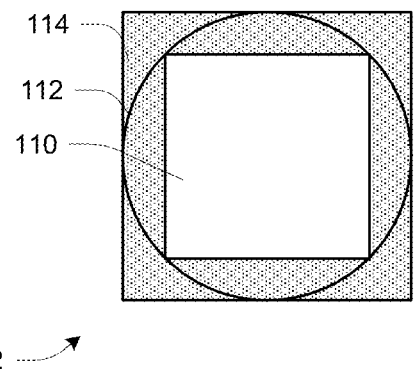
FIGS. 27(a) and 27(b) are schematic diagrams of a TOT-QCL laser active filter area.
Figure 27B:
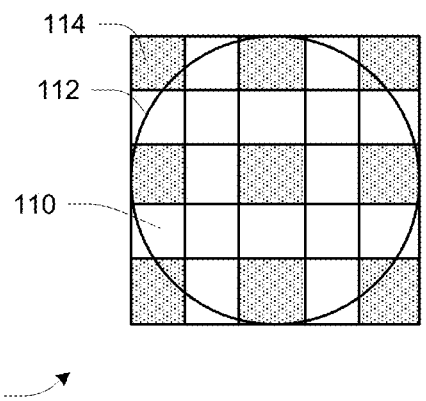

A TOT-QCL laser as shown in FIG. 27 wherein the active filter region area 110 is less than the area of the beam of the laser 112 and with filter regions within the optical path of the laser beam (excluding the active filter region) being non-tunable filter regions 114 of different optical transmission. These non-tunable filter regions 114 may have high transmission to ensure good average optical transmission in band. The non-tunable filter regions 114 may surround the filter as shown in FIG. 27a or be interspersed in the filter in a checker board or other pattern as can be achieving using photolithographic techniques as shown in FIG. 27b. In one embodiment, the active filter area 110 is at least 22% smaller than the 1/e2 diameter (or area so inscribed) of the beam. This aspect may be advantageous in reducing the thermal mass of the filter in improving the uniformity or creating a desired level of wavelength selection and cavity loss. In another embodiment, the non-tunable filter regions may be tunable but with different tunable transmission properties than the active region.

A TOT filter in which one or more of the materials comprising the cavity or DBR mirrors is thermally conductive to provide improved thermal uniformity and thus wavelength uniformity across the filter.

A TOT filter in which a thermally conductive and optically transparent material is added to the filter structure to provide improved thermal uniformity across the filter. In another aspect, this material may also be electrically conductive. In another aspect, this material may be partially reflective. Silicon or germanium may be used.

A TOT-QCL laser wherein the filter has been designed for increased transmission or improved finesse by using curved surfaces for when the incident light is only partially collimated or uncollimated.

A TOT-QCL laser package or integrated inter-filter spacing 200 of FIG. 26 that has a backfill gas that also is used for one or more of the following: (i) to act as a filter for the purpose of generating a reference or calibration signal for the laser; (ii) to act as filter in determining, at least in part, the output wavelength of the laser, (iii) to alter the time response of the filter during heating or cooling. One can then trade-off input power for tuning speed.

Use of the buried oxide in an SOI wafer as an etch stop for backside etching, the buried oxide also being a part of the opto-mechanical design of an optical filter.

A TOT filter mechanically attached to the facet of a QC laser, and which may also be optically coupled with a material with an index of refraction equal to or greater than 1. The optically coupled material may be designed with a material with a low thermal conductivity relative to silicon or with materials used in the optical cavity of the QCL. Such a filter may be curved or vary in thickness to accommodate the divergent optical output of the QC laser.

A TOT filter with a spatial thickness gradient nominally perpendicular to the optical axis that compensates for one or more of the following: (i) a thermal gradient in the filter; (ii) a diverging or converging beam incident on the filter.

A TOT filter with a spatial thickness gradient nominally perpendicular to the optical axis that is fabricated using photolithographic techniques. The thickness gradient may be uniformly positive or negative (i.e. the change in thickness from the center of the filter to the edge is constant) or the gradient may change in discrete positive or negative steps (e.g. through the use of discrete photolithographic etching steps as commonly used in MEMS processing.

A TOT-QCL with a thermally controlled element in the laser cavity that varies the optical cavity path length by thermally changing the index of refraction of the element. In one embodiment, a single layer of thermo-optic material is AR coated on both sides, and has an integrated heater which is used to change the temperature and thus the optical path length of the element.

Thermo-optic filters in a TOT-QCL that pulse the laser on and off, or substantially modulate laser output, by changing the temperature of the filter or filters and therefor their transmission, thereby enabling pulse operation or time variant operation of the laser without varying the electrical power supplied to the laser. This aspect may also be used as an optical modulator for AC coupled detectors, such as pyroelectric infrared detectors.

Thermo-optic filters in a TOT-QCL wherein both the temperature of the filter and the power to the laser are synchronously controlled to achieve a desired spectral output of the laser. For example, for a laser operated in pulse mode, by pulsing the laser electrical power, and controlling the temperature of the filters, the laser output may be modulated such that lasing is achieved for a period of time less than that which would be achieved in the absence of the thermal filters. In the same manner, the spectral linewidth or number of laser modes during the pulse may also be controlled.

A TOT-QCL wherein the electrical power to the QCL or the laser temperature is changed as a function of the temperature of the TOT filter or filters such that a desired laser output characteristic is achieved. Such an output characteristic may include one or more of the laser power level, laser longitudinal or transverse mode, number of simultaneous laser modes, and laser wavelength.

A TOT-QCL wherein the electrical power to the filter or the filter temperature is changed as a function of the laser temperature or laser electrical power such that a desired laser output characteristic is achieved. Such an output characteristic may include one or more of the laser power level, laser longitudinal or transverse mode, number of simultaneous laser modes, and laser wavelength.

A TOT-QCL wherein the gain medium of the QCL (1) achieves lasing in a spectral region where one or more substances of interest have spectral features of interest, and (2) the laser gain medium has a gain profile that is narrower than the spacing between transmission peaks of a TOT filter with multiple transmission peaks (e.g. the free spectral range for an etalon type filter). When one of the TOT filter peaks is positioned within the laser gain window, only those laser modes under that single TOT filter peak will lase. In this manner fewer TOT filters may be used in a TOT-QCL. The QCL may be designed specifically to match the TOT filter characteristics and may also be designed to operate in more than one spectral region of interest, that is have multiple gain regions, each with a width less than the free spectral range and separated by a region of low gain that does not support lasing.

A TOT-QCL where the absorption of laser light changes the temperature of a TOT filter thereby changing the wavelength of peak transmission of the filter and the preferred lasing wavelength. For a laser operating continuous wave, the laser may remain operating at a first wavelength when the TOT filter transmission peak moves to a second wavelength, thereby resulting in increased cavity losses and a reduced laser output. Similarly, for a laser operating continuous wave at wavelength not at the peak of the TOT filter, the laser may remain operating at a first wavelength when the TOT filter transmission peak moves to a second wavelength, thereby resulting in reduced cavity losses and an increased laser output.

When combined with a second TOT filter, the change in transmission wavelength in the first TOT filter due to laser absorption may increase or decrease the laser output power depending on the relative alignment of the peak transmission of the two TOT filters. By way of illustration, if the transmission peak wavelength of one TOT filter is aligned on the slope of the transmission peak of a second TOT filter, small changes in transmission wavelength of one filter with respect to the second filter may result in relatively large changes in insertion loss and thus laser power. This aspect may be useful in spectroscopic applications to provide additional gain in modulation of laser power in either CW or pulse operation. In another aspect of the design, the laser input electrical signals may be modulated. A TOT-QCL where the absorption of laser light changes the temperature of a TOT filter in a spatially non-uniform manner thereby broadening or narrowing the wavelength linewidth (e.g. number of longitudinal modes) of the laser output. By changing the current (i.e. electrical power) to the QCL, the laser power will change and thus the amount of absorption induced line broadening will change. This aspect may be useful in spectroscopic applications to provide varying probe linewidths in either CW or pulse operation while maintaining a constant laser center wavelength. In another aspect of the design, the TOT filter temperature may be changed in response to the change in laser power to maintain a preferred transmission wavelength.

A TOT-QCL where a TOT filter is used to maintain a constant wavelength of operation for varying QCL temperatures, varying QCL power levels or varying ambient or other environmental conditions.

A TOT-QCL where a TOT filter and a second optical filter are used to maintain a constant wavelength of operation for varying QCL temperatures, varying QCL power levels, varying ambient temperature or other environmental conditions. A modulated QCL power may be desired to provide an optical signal to an AC coupled infrared detector, such as a pyroelectric or acoustic detector, or it may be used to improve system sensitivity by changing the detection bandwidth, such as performed with a lock-in amplifier or spectral signal processing.

A TOT-QCL further comprising two filters: a TOT filter and a filter with a substantially lower thermo-optic coefficient thereby eliminated the need to control the temperature of the second filter. The second largely athermalized filter may be used to restrict the number of usable TOT filter transmission peaks falling within the gain curve of the QCL. By way of example, an air gap etalon may be used as an athermalized etalon.

A TOT-QCL further comprising a filter and a grating. An issue with a grating tuned external cavity QCL using mechanical motion for tuning is the difficulty of achieving wavelength stability and repeatability. A grating and TOT filter wherein a grating provides a coarse tuning capability over a broad spectral range and the TOT filter provides fine tuning at each mechanical position of the grating provides improved wavelength stability and repeatability. The tuning range of the TOT filter would be designed to exceed the coarse tuning step size and the amount of wavelength uncertainty or repeatability error in a grating only design. For example, a grating tuned QCL may have 0.2 cm-1 uncertainty in wavelength over time and TOT filter may have a tuning range of 0.4 cm-1. In one embodiment the filter and grating may be combined on a common substrate In another aspect of a TOT-QCL, a second heater may be added to the first heater of the TOT filter to induce a thermal gradient across the filter and thereby change the effective filter finesse and laser linewidth. The power to the second heater may be constant or time variant thereby either setting a finesse and linewidth or inducing a time varying finesse and line width. In this manner the number of laser longitudinal modes, reflected collimated beam power or laser output power may be changed dynamically, with or without a change in wavelength. The heater may take the form a strip along one side the filter that results in an approximate one dimensional gradient from one side of the filter to the other. Alternatively, the heater may take the form of a "point" heater in the center of the filter providing a radial thermal gradient from the center to the periphery of the filter. The first heater and second heater may be controlled together to maintain a constant average transmission wavelength as the finesse is modulated.

In another aspect of a TOT-QCL, membrane filters/etalons can deform, allowing them to act like a lens. This can be done deliberately to improve or degrade the external cavity, making the laser turn on or off, as well as shift the center wavelength. Mechanical deformation can be achieved either by thermally induced mismatch of thermal expansion, or by pressure differences across the membrane.

In another aspect of the TOT-QCL, a single filter element with multiple spectral transmission peaks ("multi-peak") within the laser gain region may be used within the cavity to select more than one simultaneous lasing mode, where these lasing modes are not adjacent or in successive order of wavelength. For a laser gain medium that could support simultaneous lasing at lambda1, lambda2, and lambda3 wavelengths, it may be useful for a single laser to support simultaneous lasing at lambda1 and lambda3 but not at lambda2, and this could be achieved by incorporating a TOT filter element with transmission peaks at lambda1 and lambda3 but not at lambda2. Wavelength discrimination may be achieved at a laser output power detector by a dichroic filter/mirror or by use of discrete filters.

In another aspect of the TOT-QCL, a TOT filter with multiple spectral transmission peaks ("multi-peak") within the laser gain region may be used within the laser cavity to select more than one non-simultaneous lasing wavelength, wherein the TOT filter temperature remains constant. One or more changes in laser operating conditions may be used to achieve the non-simultaneous lasing, including operating as a pulse laser (i.e. the laser switches on and off), changing pulse duty cycle, changing pulse duration, changing laser power, or changing laser temperature. By way of example, consider a multi-peak filter (or combinations of filters) with bandpasses at wavelength 1 and wavelength 2. If the laser temperature is changed when operating at wavelength 1, then a different wavelength of operation at wavelength 3 may be induced. However, with the TOT filter inserted into the laser cavity, wavelength 3 is less preferential for laser operation than wavelength 2 and the laser would operate at wavelength 2. In this manner certain wavelengths of operation may be preferentially selected or excluded as, for example, may be desired to select certain gas absorption lines in combination with certain reference wavelengths.

A multi-peak TOT filter can be achieved by vernier tuning of two TOT filters such that two wavelengths have equivalent transmission characteristics. It then becomes possible to rapidly switch between the two wavelengths by either small changes in TOT filter tuning or by inducing some other change in operating conditions, such as changing the laser operating temperature or drive current thereby changing the QCL gain curve characteristics. When operating in CW mode, it may be advantageous to pulse the laser current to assist in snapping to the new wavelength by breaking the preference of a CW laser to maintain its current operating wavelength despite the creation of more favorable operating conditions at another wavelength. Multi-peak filters encompass the possibility of more than two peaks using different types of filters or combinations of filters as previously discussed.

Those skilled in the art will recognize that a non-tunable multi-pass filter can achieve these results albeit without the ability to dynamically adjust for new wavelengths or operating conditions. However, at tunable TOT filter may be preferred. For example, due to changes in environmental conditions (e.g. external cavity temperature) or laser gain profile (as may occur with aging or burn in), a TOT filter can adjust its passband characteristics to compensate for the changes to ensure the desired operating wavelengths or power are maintained over time and environment.

In another aspect of the TOT-QCL, a TOT filter with multiple spectral transmission peaks ("multi-peak") within the laser gain region wherein the filter transmission peaks may be designed to match the laser gain wavelength curve or vice versa) in order to achieve lasing at more than one wavelength, either simultaneously or as a result of changes in the TOT-QCL operating conditions (e.g. laser power, pulse duration, power level or temperature).

In many industrial applications, laser stability is an important criteria for achieving reliable operation, signal to noise improvements through background scans or averaging, and low maintenance costs. Thus techniques for improving the stability of the laser system are important. One such technique is to reduce the sensitivity of the system to environmental or system perturbations through the design of one or more elements of the system. Lens athermalization is one example of this technique in optical design.

Consider a TOT-QCL in which certain longitudinal cavity modes are enhanced such that small changes in certain operational conditions do not result in changes in laser wavelength (an EM-QCL). For example, a longitudinal mode may be created by the reflections off a facet of the QC laser (e.g. an optical resonance or cavity modes are created within the QCL by facet reflections off the two ends of the QCL, or between the QCL facet and other partially or fully reflective surfaces within the external cavity). While a good anti-reflection coating on the cavity facet (surface) facing the external cavity may be desired to reduce the strength of this mode, it can also be strengthened by providing greater reflection off the facet surface. The laser will thus have an increasing preference to only lase at those wavelengths supported by the QCL cavity modes. Thus, as the TOT filter changes temperature (or, for example, the effective length of the optical cavity changes as a function of changes in the temperature of the cavity structure) the laser will stay at one wavelength until the temperature change is sufficient to create a preferred lasing condition at another QCL cavity mode. By way of example, for a typical QCL operating at 4.5 um, the QCL mode spacing may be 1 nm, and the change in TOT filter temperature to transition from longitudinal mode to longitudinal mode may exceed 5 degrees Celsius. Thus, the temperature stability requirement for the TOT filter is now reduced. Importantly, also reduced is the absolute temperature accuracy over the entire temperature range of the TOT filter. For example, if the TOT filter operates between 400° C. and 500° C., it requires a 5° C. temperature change at 500° C. to jump cavity modes, the system only needs to hold the long term temperature accuracy to 2.5° C. However, the tolerances for short term stability and long term repeatability are not independent and must be allocated and traded off in the system design.

A facet of the QCL may be uncoated in order to enhance the facet reflectivity. The coating may be deposited on the facet with a reflectivity of greater than 1% to enhance a longitudinal cavity mode. A trade-off exists between the strength of the mode selection (by increasing the facet reflectivity) and the increase in laser threshold that occurs as the TOT filter is tuned away from the mode wavelength (which can result in a change in laser power as the TOT filter tunes).

For some applications, a longitudinal spacing of more or less than 1 nm may be desirable. Other surfaces within the external cavity may then be used to obtain the desired spacing. Alternatively, a mode creating optical element, such as an etalon or other filter structure may be introduced into the cavity with the right mode spacing and surface reflectivity to achieve the desired wavelength and mode strength. This optical element may be athermalized or mounted to a TE cooler to achieve the desired temperature stability and repeatability. The mode spacing may be further adjusted by angling the element with respect to the optical axis, and either fixed in place or made adjustable dynamically through mechanical means (e.g. a piezoelectric driver).

A laser may have more than one mode enhancing structure. For example, there are longitudinal modes created by the laser chip as just described, by the EC (external cavity) reflective (or output coupling) mirror and another at least partially reflective surface, and by other optical surfaces within the EC. A TOT-QCL may be designed to have multiple mode creating structures at different wavelengths (i.e. spacings) and at different strengths (e.g. the etalon cavity 44 of FIG. 7). For example, a set of weak cavity modes may be created by surfaces with relatively good anti-reflection coatings and a short wavelength spacing between modes (i.e. a thick low Q etalon) while a second set of strong cavity modes may be created at a wavelength spacing greater than the first set (i.e. a QC chip with poor AR facet coatings). The first set of cavity modes may be spaced at a wavelength to achieve a desired spectral resolution of the laser. The second set of cavity modes may be a spacing that facilitates calibration of the laser over greater wavelengths, longer periods of time, over changes in environmental conditions or for other reasons. Different combinations of mode spacings and mode strengths can thus be envisioned, each with particular advantages with respect to maintaining a desired wavelength or power repeatability, stability or spacing of laser wavelengths, or a particular level of power modulation over laser operating conditions.

In the EM-QCL as described, the laser may be operated in pulse or CW operation. If operated in CW, the laser may "lock" onto a given wavelength such that as the TOT filter is used to tune the laser, the laser "sticks" on a given frequency (and longitudinal mode), thus forcing the TOT filter to tune even beyond the point where the peak of the TOT filter transmission aligns with the next longitudinal, mode to achieve a change in lasing wavelength at the adjacent longitudinal mode. This has the further disadvantage that as the TOT filter tunes further from the optimal wavelength for the current wavelength of operation, the threshold power increases and the output power from the laser is reduced. The laser operating in CW mode may be pulsed in order to mitigate or eliminate this effect by allowing the laser to lase, when pulsed back on, at the wavelength where the TOT filter and longitudinal cavity modes are most closely aligned.

Thus, a method of tuning the TOT-QCL laser in CW operation is as follows:

1. Establish a first wavelength of operation of the laser where a longitudinal cavity mode of the laser and the TOT filter bandpass are aligned (note: the TOT filter may consist of one or more optical filters and the longitudinal cavity mode may be an effective mode created by a combination of mode creating surfaces within the TOT-QCL).

2. Adjust the TOT filter to the wavelength location of a second longitudinal mode for the laser, the laser continuing to lase at the first wavelength of operation 3. Reduce the laser electrical power in single pulse such that the laser lases at the wavelength corresponding to the second longitudinal mode of the laser In another aspect, the laser is continually pulsed at a very long duty cycle (i.e. 99.9% full power, 1% reduced power) and short pulse time (i.e. 1 usec) relative to the time that the laser is being used to collect data. This replaces step 3 as just described.

In another aspect, the alignment of the cavity mode to the TOT filter transmission peak is determined by a method of varying the TOT filter wavelength to maximize the laser power.

In another aspect, a control loop is used to maintain the maximum output power at a given cavity mode wavelength wherein the control is achieved by 1) setting a desired wavelength of operation; 2) monitoring the laser output power with a detector, and 3) changing the temperature of the TOT filter to achieve a desired power, or power and wavelength, outcome.

In another aspect, the lasing wavelength of the TOT-QCL is changed by changing the temperature or other operating condition of the cavity mode determining device. By way of example, the cavity mode determining device may be the QC laser wherein the cavity modes of the laser are the chip modes of the QC laser, determined at least in part by the length and temperature of the QC laser. The temperature of the TOT filter may be changed at the same time as the change in cavity mode wavelength in order to keep the wavelengths of the cavity mode and TOT filter aligned. A control loop may be used to maintain the alignment wherein either the TOT filter or cavity mode determining device is adjusted to maintain maximum power.

In another aspect, the control loop will operate to maintain constant power rather than maximum power. By this means the laser power may be held constant at each wavelength where the laser is used to generate measurement data.

In another aspect, the wavelength of the cavity mode is changed by changing the current input to the QC laser. A control loop may be used to maintain constant laser output power through control of the TOT filter as the laser current is changed. By way of example, adjusting the wavelength of the transmission peaks of two TOT filters relative to each other, the center wavelength and the FWHM bandpass of the combined filter transmission can be controlled. In another aspect, a control loop may be used to maintain constant laser output power through control of the laser temperature as the QCL current is changed. In another aspect, a control loop may be used to control the laser input current as the temperature of the QCL laser is changed.

In another embodiment, certain optical absorption features within the TOT filter (cavity or DBR materials) may be used to provide a wavelength reference. For example, a TOT filter comprised of amorphous silicon is known to have an absorption feature at around 5 um. The TOT filter may also be designed with materials with specific absorption features. For example, a TOT filter with silicon as its optical cavity may have the silicon doped with an impurity that provides one or more absorption features that may be used as an optical reference for calibrating the TOT-QCL as it sweeps across its tunable wavelengths (i.e. the filter will have reduced transmission at the absorption wavelength(s), resulting in a modulation in laser output power relative to the non-absorptive wavelengths). Alternatively, a coating may be deposited on the filter to achieve absorption features.

The mode creating optical element may also be used as an optical reference within the system.

The filters can be highly integrated as discussed previously for FIG. 26. In this embodiment, the filter die are bonded together, either at the die or wafer level using any one of a number of techniques known to those conversant in MEMS technology. Also using MEMS process techniques, it is possible to have the gap or cavity between the filters be sealed or relieved with holes to allow gas to readily enter the space between the filters. It may be advantageous to have the gap sealed and evacuated (as is readily possible using wafer bonding techniques) or back filled with a known gas. The gas may have a thermal conductivity that is higher or lower than that of nitrogen. The gas may also have spectral absorption at reference wavelengths useful for maintaining the wavelength calibration and stability of a system. Stacking of more than two filters is also possible, provided spaces or etched cavities are used to avoid thermal contact between thermally isolated filter elements and semiconductor techniques for enabling electrical contact to buried leads are used. The bonded filters as a single assembly may then be thermally attached to a thermally conductive substrate or mount The gain curve of the QCL may also provide a reference wavelength. The QCL gain curve contains at least one peak (FIG. 2) or other spectral feature, which results in a peak or spectral features in the power output of the TOT-QCL. The gain curve of the QCL may be constructed to provide features within the gain curve to act as wavelength references. As the TOT-QCL is tuned across the gain curve, the resulting power spectral density output of the laser may be analyzed to determine the location of a known QCL spectral feature with respect to the temperature of the TOT QCL filter. In this manner, the calibration of TOT filter temperature versus laser wavelength can be recalibrated over time to account for drifts or instabilities in the TOT-QCL system. Additional spectral reference points can be used to increase the accuracy of the reference calibration.

It is well known that some lasers exhibit transverse as well as longitudinal modes. A QCL may have a single transverse mode (e.g. TEM00) or it may exhibit multiple transverse modes. In many applications, a single TEM00 mode is preferred. However, a given QCL, due to design or fabrication, may exhibit non-TEM00 behavior. A TOT filter in an external cavity may be used to provide feedback into the QCL laser cavity to preferentially select a preferred transverse mode of operation. Preferential feedback may be achieved by providing higher intra cavity gain for the preferred mode of operation. The TOT filter may be designed with a spatial gradient orthogonal to the optical path to increase the loss of certain transverse laser modes. In another aspect, the filter may be surrounded by a material that absorbs or is non-transmissive at the operating wavelengths of the QCL such that part of the collimated beam is blocked when passing through the filter.

While many of the embodiments described here are useful for use as intra-cavity elements within an external cavity laser, they may also be useful as tunable wavelength selection filters for lasers or other optical sources with spectral outputs at multiple wavelengths, for example a Fabry Perot QCL. The tunable filter may be used to select one or more spectral wavelengths of interest for the optical source.

A TOT filter may also be used in conjunction with a QCL to create a laser source emitting simultaneously at multiple wavelengths as previously described. By way of example, as previously disclosed, a single TOT may have multiple passbands spaced at the free spectral range of the TOT filter. When used as a tunable element in an EC-QCL, the laser may be operated so that the laser creates an optical output at more than one wavelength where the TOT filter passbands and the above threshold laser gain curve intersect. The TOT filter may then be tuned over the free spectral range to achieve full spectral coverage, albeit with multiple laser output wavelengths at each operating point of the TOT filter.

Such a simultaneous wavelength laser source may be used as a high brightness broadband source as in the spectrometer of Pflugl, et al (US2011/0058176 A1). However, whereas Pflugl describes static broadband single sources (e.g. FP lasers), or multiple narrowly tunable broad band sources acting as a single source, we describe a single laser simultaneously generating multiple narrow spectral emissions that are then tunable over time to generate the desired broadband spectral wavelength coverage.

When combined with a wavelength dispersive element such as an interferometer, this TOT-QCL simultaneous wavelength source can achieve with a single laser much broader spectral coverage (using scanning and tunability) or the same coverage as an array QC lasers each operating at a different wavelength (possibly without scanning and with narrow FSRs). In comparison to a mode of operation with two TOT filters to achieve a single wavelength of operation, the simultaneous source and interferometer eliminates the need for a second TOT filter while providing previously unobtainable (with broadband incoherent sources) very narrow high power spectral lines at spectral wavelengths measured simultaneously by the interferometer.

When used with an interferometer, the simultaneous source may be tuned at a rate that is slower then, faster then or in phase with the scanning of the interferometer. If scanned slower than the interferometer, than a typical mode of operation would be to collect an interferometer scan, tune the source to a new operating point thereby outputting a new set of simultaneous wavelengths, followed by a second interferometer scan.

Aspects of Novelty

Distinct groupings of aspects of novelty are outlined below with respective numberings 1s, 100s, 200s, 300s, 400s, 500s and 600s.

1. A tunable laser with a laser output, comprising:
   a solid state laser medium comprising an optical gain region and operative to generate coherent radiation through a facet in response to an electrical signal;
   a lens operative to collect the coherent radiation and generate a collimated light beam;
   a reflective surface for reflecting the collimated beam back to the lens and the laser medium thereby creating an external laser cavity;
   an optical filter comprising two surfaces with a thermally tunable optical transmission band within the optical gain region of the laser medium, the optical filter positioned within the external laser cavity between the reflective surface and lens, and operative to
   (1) transmit a collimated beam at a desired wavelength of operation, and
   (2) specularly reflect a collimated beam from each surface, the collimating beam incident on the optical filter such that the reflected collimated beams propagate at an angle with respect to the incident collimated beam 2. The tunable laser of 1 further comprising a second optical filter with a thermally tunable transmission band within the operative range of the laser medium and positioned within the external laser cavity between the reflective surface and lens, and operative to
   (1) transmit the collimated beam at a desired wavelength of operation, and
   (2) specularly reflect a collimated beam from each surface, the collimating beam incident on the optical filter such that the reflected collimated beams propagate at an angle with respect to the incident collimated beam
   (3) transmit radiation in the same band as the first optical filter at a first wavelength and block transmission at a second wavelength 3. The tunable laser of 2, wherein the first and second optical filters are etalons, each filter with a different free spectral range and configured to operate as tunable vernier filters to generate a tunable laser 4. The tunable laser of 1, wherein the reflective surface is partially transmitting to generate the laser output 5. The tunable laser of 1, wherein a specularly reflected collimated beam is the laser output 6. The tunable laser of 1, wherein the power of specularly reflected collimated beam varies as a function of thermally tuning the optical filter 7. The tunable laser of 6, wherein specularly reflected collimated beam is used as a reference signal 8. The tunable laser of 1, wherein the tunable filter and reflective surface are combined on an optically transparent common substrate 9. The tunable laser of 1, wherein the tunable filter and reflective surface are combined on a common substrate, the common substrate comprising an aperture for transmitting the collimated beam 10. The tunable laser of 1, wherein the power of the specularly reflected collimated beam has an inverse relationship to the power of the laser output 11. The tunable laser of 1, wherein the laser gain medium, lens, optical filter and reflective surface are mounted to a temperature stabilized thermally conductive substrate 12. The tunable laser of 1, wherein the tunable filter and lens are combined to form a single assembly 13. The tunable laser of 1, wherein the spatial diameter of a thermally tunable transmissive region of the optical filter at the desired wavelength of operation of the tunable optical filter is at least 22% smaller than the 1/e2 diameter of the collimated beam 14. The tunable laser of 13, wherein the tunable transmissive region is further comprising a region simultaneously transmissive at all wavelengths of operation of the tunable laser 15. The tunable laser of 1, wherein the optical filter is an etalon, the free spectral range of the etalon exceeding the wavelength width of the optical gain region of the solid state laser medium 16. The tunable laser of 1, wherein the optical filter is an etalon and the optical gain region of the solid state laser medium having a wavelength region of lower gain interspersed between regions of higher gain, the region of lower gain corresponding to an optical passband of the etalon.

17. The tunable laser of 1, wherein the wavelength of the thermally tunable transmission band changes as a result of absorption of the collimated beam 18. The tunable laser of 17 further comprising control circuitry, the control circuitry operative to change the temperature of the optical filter in response to the absorption of the collimated beam 19. The tunable laser of 1 wherein the optical filter is an etalon, the tunable laser further comprising an athermalized etalon, the free spectral range of the optical filter etalon being less than the free spectral range of the athermalized etalon 20. The tunable laser of 1 further comprising an optical grating for mechanically tuning the laser output 21. The tunable laser of 1 further comprising control electronics and laser power detector operative to maintain a constant laser output power by changing the temperature of the optical filter 22. The tunable laser of 1 further comprising control electronics and laser power detector operative to maintain a constant laser output power by changing power of the specularly reflected collimated beam

- - -

100. A thermally tunable optical filter comprising
   a thermally conductive substrate;
   a filter region comprising a thermo-optic material and two distributed Bragg reflectors, the filter region having a thickness in the direction of optical propagation less than the thickness of the thermally conductive substrate;
   a thermal isolation region connecting the substrate and filter region, the thermal isolation region having a temperature gradient;
   a patterned thin film heater for changing the temperature of the filter region in response to electrical signals, the heater being connected thermally to the filter region and isolated from the substrate by the thermal isolation region;
   a patterned temperature sensor thermally connected to the filter region;
   an optical transmissive wavelength within the filter region that varies in response to electrical signals provided to the heater; and
   control circuitry operative to control the heater electrical signals 101. The thermally tunable filter of 100, wherein the thin film heater is optically transmissive and substantially covers the filter region
102. The thermally tunable filter of 100, wherein the shape and location of the thin film heater reduces thermal nonuniformities in the filter region
103. The thermally tunable filter of 100, wherein the optical transmission varies spatially in a direction orthogonal to preferred direction of optical propagation to reduce spatial variation in optical bandpass
104. The thermally tunable filter of 100, wherein the distributed Bragg reflectors comprise a thermally conductive layer
105. The thermally tunable filter of 100 further comprising a thermally conductive, optically transparent and electrically conductive layer
106. The thermally tunable filter of 100, wherein the filter region is a curved surface
107. The thermally tunable filter of 100, wherein the substrate comprises a buried oxide layer
108. The thermally tunable filter of 100, wherein the patterned thin film heater is patterned to generate a spatially varying optical bandpass in the optical transmission region
109. The thermally tunable filter of 100, wherein the patterned thin film heater is patterned to reduce a spatially varying optical bandpass in the optical transmission region
110. The thermally tunable filter of 102 further comprised of a second independently controlled heater

- - -

200. An external cavity semiconductor laser comprising
    a solid state laser medium operative to generate coherent radiation through a first facet in response to an electrical signal;
    a lens operative to collect the coherent radiation and generate a collimated light beam;
    a reflective surface for reflecting the collimated beam back to the lens and the laser medium thereby creating an external laser cavity;
    a thermo-optic thin film filter with a spatial thickness gradient perpendicular to the direction of optical propagation of the collimated light beam
201. The external cavity semiconductor laser of 200, wherein the thickness gradient is composed of discrete changes in optical thickness
202. The external cavity semiconductor laser of 200, further comprising thermo-optic material for changing the optical path length of the external cavity as a function of the temperature of the thermo-optic material

- - -

300. An external cavity tunable laser with a laser output comprising
    a solid state laser medium operative to generate coherent radiation through a first facet in response to a laser electrical signal;
    a lens operative to collect the coherent radiation and generate a collimated light beam;
    a reflective surface for reflecting the collimated beam back to the lens and the laser medium;
    two thermo-optic thin film filters, each with a heater, and together operative as an optical vernier wavelength tuner;
    control circuitry operative to generate heater signals for controlling the temperature of the thermo-optic thin film filters and modulate the vernier optical passband and the laser output power
301. The external cavity tunable laser with a laser output of 300, wherein the modulation of the vernier optical passband turns on and off the laser output
302. The external cavity tunable laser with a laser output of 300, wherein the modulation of the laser output power is substantially sinusoidal
303. The external cavity tunable laser with a laser output of 300, wherein the control circuitry synchronously modulates the vernier optical passband and the laser electrical signal
304. The external cavity tunable laser with a laser output of 300, wherein the laser output is a pulse signal and the synchronous modulation varies the time duration of the signal pulse
305. The external cavity tunable laser with a laser output of 300, wherein the laser temperature is controlled and the control circuitry synchronously modulates the vernier optical passband and the laser temperature

- - -

400. An external cavity tunable laser with a laser output comprising
    a solid state laser medium operative to generate coherent radiation through a first facet in response to a laser electrical signal;
    a lens operative to collect the coherent radiation and generate a collimated light beam;
    a reflective surface for reflecting the collimated beam back to the lens and the laser medium;
    two thermo-optic thin film filters, each with a heater, and together operative as an optical vernier wavelength tuner;
    control circuitry operative to generate heater signals for controlling the temperature of the thermo-optic thin film filters to modulate the vernier optical passband and maintain a substantially stable laser output power
401. The external cavity tunable laser with a laser output of 400, wherein the control circuitry synchronously modulates the vernier optical passband and the laser electrical signal
402. The external cavity tunable laser with a laser output of 401, wherein the laser output is a pulse signal and the synchronous modulation varies the time duration of the signal pulse
403. The external cavity tunable laser with a laser output of 400, wherein the laser temperature is controlled and the control circuitry synchronously modulates the vernier optical passband and the laser temperature
404. The external cavity tunable laser with a laser output of 400, wherein the laser output is maintained at a constant wavelength

- - -

405. A tunable laser generating a laser output comprising:
    a solid state laser medium operative to generate coherent radiation through a first facet in response to an electrical signal;
    a lens operative to collect the coherent radiation and generate a collimated light beam;
    a reflective surface for reflecting the collimated beam back to the lens and the laser medium thereby creating an external laser cavity;
    an optical filter with an optical thermally tunable transmission band within the operative range of the laser medium and positioned within the external laser cavity between the reflective surface and lens, the tunable transmission band changing wavelength due to absorption of the collimated beam
406. The tunable laser of 406 wherein the laser output power is modulated by the absorption of the collimated beam 407. The tunable laser of 406 wherein the optical linewidth of the laser output is increased by the absorption of the collimated beam

- - -

500. A thermally tunable optical filter assembly comprising
   a first and second thermally conductive substrate;
   a first and second thermo-optic filter region thermally isolated from the first and second substrate, the first and second filter regions having a first and second free spectral range respectively;
   a temperature control assembly for controlling the temperature of the first and second filter region;
   the first and second thermally conductive substrates bonded together to create a thermal isolation gap between the first and second filter regions 501. The thermally tunable optical filter assembly of 500, wherein the thermal isolation gap contains a vacuum 502. The thermally tunable optical filter assembly of 500, wherein the thermal isolation gap contains a gas with absorption lines within an optical transmission bandpass of the first thermo-optics filter region 503. The thermally tunable optical filter assembly of 500, wherein the surfaces of the first and second filter regions facing the thermal isolation gap create an etalon with an optical transmission bandpass within the optical transmission bandpass of the first and second filter regions 504. The thermally tunable optical filter assembly of 500, wherein the surfaces of the first and second filter regions facing the thermal isolation gap are non-parallel

- - -

600. A method of tuning an external cavity laser comprising
   Supplying a control signal to a laser gain medium to generate a continuous wave operation laser output;
   Setting a first operating condition of a tunable component within the external cavity to select a first optical feedback and a first wavelength of laser operation;
   Changing to a second operating condition of the tunable component within the external cavity to select a second optical feedback, the laser still operating at the first wavelength
   Generating a pulse within the control signal to begin a second wavelength of laser operation.

601. A method of tuning an external cavity laser of 600, wherein the pulse length is less than 10 microseconds 602. A method of tuning an external cavity laser of 600, wherein the pulse is created by modulating the control signal by less than 50% of its initial amplitude 603. A method of tuning an external cavity laser of 600, wherein an intracavity optical mode is used to maintain laser operation at the first wavelength while changing the operating condition of the tunable component 604. A method of tuning an external cavity laser of 603, wherein the intracavity mode is created between facets of the gain medium 605. A method of tuning an external cavity laser of 603, wherein the intracavity mode is created between a facet of the gain medium and an external cavity mirror 606. A method of tuning an external cavity laser of 603, wherein the intracavity mode is created by the tunable component 607. A method of tuning an external cavity laser of 600, wherein the tunable component is a grating, the operating condition is mechanical position and the optical feedback condition is a wavelength reflection peak.

608. A method of tuning an external cavity laser of 600 wherein the tunable component is a thermo-optic filter, the operating condition is temperature, and the feedback condition is optical bandpass wavelength.

While various embodiments of the invention have been particularly shown and described, it will be understood by those skilled in the art that various changes in form and details may be made therein without departing from the spirit and scope of the invention as defined by the appended claims.

What is claimed is:

1. A tunable laser with a laser output, comprising:
   a solid state laser medium having an optical gain region and operative to generate a coherent optical signal through a facet in response to an electrical signal;
   control electronics supplying an electrical signal to the solid state laser medium;
   a lens operative to collect the coherent optical signal and generate a collimated light beam; and
   components of an external cavity including a wavelength selection device and a surface operative to reflect the collimated beam back into the solid state laser medium, wherein the tunable laser is operative to:
   (1) use the wavelength selection device to tune to a first optical wavelength to achieve laser continuous wave output at a first wavelength of operation,
   (2) use the wavelength selection device to tune to a second optical wavelength, the tunable laser continuing to generate continuous wave output substantially at the first wavelength of operation, and
   (3) pulse the laser medium coherent optical signal to tune the laser output from the first wavelength of operation to a second wavelength of continuous wave operation substantially at the second optical wavelength.

2. The tunable laser of claim 1, wherein the pulse of the laser medium coherent optical signal is created by an electronic pulse with a low duty cycle and optical power of the tunable laser output increases following the pulse.

3. The tunable laser of claim 1, wherein the optical gain region of the solid state laser medium has a wavelength region of lower optical gain interspersed between wavelength regions of higher optical gain.

4. The tunable laser of claim 3 wherein the wavelength selection device is an etalon with a free spectral range and a width of the wavelength region of higher optical gain is less than the free spectral range.

5. A method of tuning an external cavity semiconductor laser, comprising:
   (1) setting a first operating condition of a wavelength selection device within the external cavity to select a first optical feedback selection wavelength and a first lasing wavelength of continuous wave laser operation,
   (2) changing to a second operating condition of the wavelength selection device within the external cavity to select a second optical feedback selection wavelength, the external cavity semiconductor laser continuing to generate continuous wave laser output substantially at the first lasing wavelength, and
   (3) pulsing a semiconductor laser gain medium control signal to tune the laser operation from the first wavelength of continuous wave laser operation to a second lasing wavelength of continuous wave operation.

6. The method of tuning of claim 5 wherein the first lasing wavelength is at a first longitudinal mode of the external cavity and the second lasing wavelength is at a second longitudinal mode of the external cavity.

7. The method of tuning of claim 6 wherein a first bandpass of the wavelength selection device and the first longitudinal mode are substantially aligned at the first lasing wavelength and a second bandpass of the wavelength selection device and the second longitudinal mode are substantially aligned at the second lasing wavelength.

8. The method of tuning of claim 7 wherein the alignment is determined by changing a bandpass wavelength of the wavelength selection device and monitoring laser output power.

9. The method of tuning of claim 5 wherein the pulsing of the semiconductor laser gain medium control signal is performed continuously at a low off duty cycle and each pulse reduces electrical power supplied to the laser semiconductor gain medium.

10. A tunable laser with a laser output, comprising:
a solid state laser medium having an optical gain region and operative to generate coherent radiation through a facet in response to an electrical signal;
control electronics supplying the electrical signal to the solid state laser medium;
a lens operative to collect the coherent radiation and generate an optical beam; and
components of an external cavity including a wavelength selection device and a surface operative to reflect the optical beam back into the solid state laser medium, wherein the wavelength selection device includes multiple optical wavelength pass bands separated by wavelength bands of lower transmission, all within the optical gain region of the solid state laser medium, and wherein the tunable laser is operative to provide simultaneous lasing at multiple lasing wavelengths, the lasing wavelengths coinciding substantially with the optical pass bands, the lasing wavelengths changing over time due to tuning of the tunable laser, and wherein the tunable laser further includes a spectrometer operative to receive the tunable laser output and measure optical power output at each simultaneous wavelength of tunable laser operation.

11. A tunable laser with a laser output, comprising:
a solid state laser medium having an optical gain region and operative to generate coherent radiation through a facet in response to an electrical signal;
control electronics supplying the electrical signal to the solid state laser medium;
a lens operative to collect the coherent radiation and generate an optical beam; and
components of an external cavity including a wavelength selection device and a surface operative to reflect the optical beam back into the solid state laser medium, wherein the optical gain region of the solid state laser medium has a wavelength band of lower optical gain interspersed between wavelength bands of higher optical gain, a wavelength band of higher optical gain being selected to provide lasing where one or more substances have optical wavelength absorption features of interest.

12. The tunable laser of claim 11 wherein the wavelength selection device is an etalon and a width of a wavelength band of higher optical gain is less than a free spectral range of the etalon.

13. The tunable laser of claim 11, wherein the wavelength selection device is an etalon, and the laser medium wavelength band of lower gain corresponds to an optical passband of the etalon and the wavelength band of lower gain does not support lasing of the tunable laser.

* * * * *